United States Patent [19]

Ishikawa et al.

[11] Patent Number: 5,982,236
[45] Date of Patent: Nov. 9, 1999

[54] HIGH-FREQUENCY POWER AMPLIFIER

[75] Inventors: Osamu Ishikawa, Kyoto; Takahiro Yokoyama, Hyogo; Taketo Kunihisa, Osaka; Junji Ito, Osaka; Masaaki Nishijima, Osaka; Shinji Yamamoto, Osaka, all of Japan

[73] Assignee: Matsushita Electric Industrial Co., Ltd., Osaka, Japan

[21] Appl. No.: 09/009,241

[22] Filed: Jan. 20, 1998

[30] Foreign Application Priority Data

Jan. 21, 1997 [JP] Japan .................................. 9-008254

[51] Int. Cl.$^6$ ............................ H03F 3/191; H03F 3/68
[52] U.S. Cl. ......................... 330/296; 330/140; 330/302; 330/310
[58] Field of Search .................... 330/140, 277, 330/285, 286, 290, 296, 302, 307, 310

[56] References Cited

U.S. PATENT DOCUMENTS

| | | | |
|---|---|---|---|
| 5,373,251 | 12/1994 | Kunimoto et al. | 330/285 X |
| 5,757,237 | 5/1998 | Staudinger et al. | 330/296 |

FOREIGN PATENT DOCUMENTS

| | | |
|---|---|---|
| 0451909 | 4/1991 | European Pat. Off. . |
| 0481741 | 10/1991 | European Pat. Off. . |
| 51-139240 | 12/1976 | Japan . |
| 59-015312 | 1/1984 | Japan . |
| 04284008 | 10/1992 | Japan . |
| 06310949 | 11/1994 | Japan . |
| 06350361 | 12/1994 | Japan . |
| 07154169 | 6/1995 | Japan . |
| 07202585 | 8/1995 | Japan . |
| 8-186455 | 7/1996 | Japan . |
| 2301964 | 12/1996 | United Kingdom . |
| WO 94/01930 | 1/1994 | WIPO . |

OTHER PUBLICATIONS

K.J. Youn, et al., "Low dissipation power and high linearity PCS power amplifier with adaptive gate bias control circuit", Electronics Letters, Aug. 15, 1996, vol. 32, No. 17, pp. 1533–1535.

Primary Examiner—Steven J. Mottola
Attorney, Agent, or Firm—McDermott, Will & Emery

[57] ABSTRACT

A high-frequency power amplifier comprises a transistor for high-frequency power which operates and whose current-voltage characteristics greatly change when positive voltage is supplied on its input terminal, an input bias circuit, an output bias circuit, an input impedance matching circuit, an output impedance matching circuit, and a positive voltage generation circuit. The positive voltage generation circuit comprises a detection circuit which detects part of the high-frequency power which is entered to or outputted from the transistor for high-frequency power, a rectification circuit which rectifies the part of the high-frequency power outputted from the detection circuit and outputs pulsating positive voltage, and a smoothing circuit which smoothes the pulsating positive voltage outputted from the rectification circuit and outputs positive voltage. The positive voltage generation circuit outputs positive voltage which increases or decreases in accordance with an increase or decrease in the detected part of the high-frequency power to the input terminal of the input bias circuit, without intervention of a direct-current power supply.

16 Claims, 19 Drawing Sheets

HIGH-FREQUENCY POWER AMPLIFIER

BACKGROUND OF THE INVENTION

The present invention relates to a high-frequency power amplifier, and more specifically to a high-frequency power amplifier which comprises a transistor for high-frequency power, an input bias circuit connected with the input terminal of the transistor, an output bias circuit connected with the output terminal of the transistor, an input impedance matching circuit connected with the input terminal of the transistor, an output impedance matching circuit connected with the output terminal of the transistor, and a bias voltage generation circuit for generating direct-current bias voltage required in the input bias circuit.

The high-frequency power amplifier is used in the transmission unit of mobile communication equipment, and has a function to amplify a modulated signal so as to have a predetermined output power.

At present, the most common frequencies used for portable phones are 1 GHz to 2 GHz, and the output power of the high-frequency power amplifiers having these frequencies is about 20 dBm to 36 dBm. In order to produce high-frequency power in this range, a multistage high-frequency power amplifier, which has two or three stages and a gain of about 30 dB, is usually used. The multistage high-frequency power amplifier amplifies a modulated wave output of about 0 dBm so as to have a transmission output of about 30 dBm. The transmission output thus amplified is transmitted as an electric wave from the antenna.

The transistor for high-frequency power used in a high-frequency power amplifier can be a MOSFET, a bipolar transistor formed on a silicon substrate, a MESFET, or a heterojunction transistor including a FET formed on a semiconductor substrate containing a compound such as gallium-arsenic (GaAs). A general method of using such a transistor for high-frequency power under the conditions of few distortions and a favorable gain is to have a direct-current bias power supply connected with the input and output terminals of the transistor, and to have high-frequency power enter the transistor to start the amplification operation while the direct-current bias power supply supplies the transistor with a predetermined bias current, A first conventional high-frequency power amplifier having the above-mentioned structure will be described as follows with reference to FIG. 15.

FIG. 15 shows the circuit structure of the first conventional high-frequency power amplifier. In FIG. 15, $Tr_a$ and $Tr_b$ represent a former-stage transistor for high-frequency power and a latter-stage transistor for high-frequency power, respectively, and their source terminals are grounded.

The input terminal (gate terminal) of the former-stage transistor $Tr_a$ is connected with an input impedance matching circuit 1 which consists of an inductor L and capacitors C. The input impedance matching circuit 1 matches the impedance of the high-frequency power entered from an external input terminal $RF_{in}$ and the input impedance of the former-stage transistor $Tr_a$ so as to reduce the reflection and the loss of the entered high-frequency power.

The input terminal of the former-stage transistor $Tr_a$ is connected with an end of a first microstrip line $S_1$ having a ¼ wavelength as a first input bias circuit, while a negative power supply $-VGG_1$ is connected with the other end of the first microstrip line $S_1$. The input terminal of the former-stage transistor $Tr_a$ is supplied with negative direct-current bias voltage through the negative power supply $-VGG_1$ and the first microstrip $S_1$. The negative power supply $-VGG_1$ is connected with a bypass capacitor $C_{b1}$ which suppresses the oscillation of high-frequency power, thereby preventing the high-frequency power from flowing towards the negative power supply $-VGG_1$. As the first input bias circuit, the first microstrip line $S_1$ having a ¼ wavelength can be replaced by a resistance having several KΩ.

On the other hand, the output terminal (drain terminal) of the former-stage transistor $Tr_a$ is connected with a positive power supply $+VDD1$, via a second microstrip line $S_2$ having a ¼ wavelength as a first output bias circuit, and is supplied with a positive direct-current bias voltage.

In the same manner as the former-stage transistor $Tr_a$ for high-frequency power, the input terminal of the latter-stage transistor $Tr_b$ for high-frequency power is connected with a negative power supply $-VGG_2$, via a third microstrip line $S_3$ having a ¼ wavelength as a second input bias circuit, whereas the output terminal is connected with a positive power supply $+VDD_2$ via a fourth microstrip line $S_4$ having a ¼ wavelength as a second output bias circuit.

An interstage impedance matching circuit 2 is connected between the output terminal of the former-stage transistor $Tr_a$ and the input terminal of the latter-stage transistor $Tr_b$, so as to match the output impedance of the former-stage transistor $Tr_a$ and the input impedance of the latter-stage transistor $Tr_b$. The interstage impedance matching circuit 2 consists of an inductor L and capacitors C, like the input impedance matching circuit 1. The interstage impedance matching circuit 2, which performs an impedance matching between the former-stage transistor $Tr_a$ and the latter-stage transistor $Tr_b$ in a multistage high-frequency power amplifier which has plural transistors for high-frequency power, has a function as an output impedance matching circuit for the former-stage transistor $Tr_a$, and a function as an input impedance matching circuit for the latter-stage transistor $Tr_b$. The output terminal of the latter-stage transistor $Tr_b$ is connected with an output impedance matching circuit 3, which consists of an inductor L and capacitors C. The output impedance matching circuit 3 matches the output impedance of the latter-stage transistor $Tr_b$ and the impedance of the high-frequency power outputted from an external output terminal $RF_{out}$.

The first conventional high-frequency power amplifier amplifies the high-frequency power (a high-frequency signal) entered from the external input terminal $RF_{in}$ in the former-stage transistor $Tr_a$ and the latter-stage transistor $Tr_b$, and then outputs the amplified high-frequency power from the external output terminal $RF_{out}$.

The former-stage and latter-stage transistors $Tr_a$ and $Tr_b$ in the first conventional high-frequency power amplifier have the current-voltage characteristics shown in FIG. 16 (a). To be more specific, when the gate voltage $V_g$ is negative, for example $-2$ V, the drain current $I_{ds}$ hardly flows, whereas as the gate voltage $V_g$ gets closer to 0 V, the drain current $I_{ds}$ flows more. Consequently, in order to reduce the drain current $I_{ds}$, it is necessary to provide a direct-current bias power supply which makes the gate voltage Vg about $-1$ V to $-1.5$ V.

Therefore, in the first conventional high-frequency power amplifier, the direct-current bias voltage of the former-stage and latter stage transistors $Tr_a$ and $Tr_b$ is set as follows. Each input terminal is connected with a negative power supply $-VGG_1$ ($-VGG_2$) having a value of minus several volts, whereas each output terminal is connected with a positive power supply $+VDD_1$ ($+VDD_2$) having about 6 V. Thus a drain current having a predetermined bias current, such as 100 mA, flows by means of these negative and positive power supplies.

However, the first conventional high-frequency power amplifier has a drawback concerning its troublesome bias current setting as follows. The amplifier needs two direct-current bias power supplies: a negative power supply $-VGG_1$ (and/or $-VGG_2$), which is a negative direct-current bias power supply and a positive power supply $+VDD_1$ ($+VDD_2$), which is a positive direct-current bias power supply. As a result, their structure and the peripheral circuits become complicated. In addition, the accuracy of the bias voltages of these direct-current bias power supplies must be set at 10% or below of the pre-determined bias voltage to prevent the impedance of the transistor $Tr_a$ (and/or $Tr_b$) from changing, so as to secure impedance matches, satisfactory distortion characteristics, and gains.

The first conventional high-frequency power amplifier has another drawback concerning an increase in the operating current as follows. The direct-current bias current is made to flow constantly in the amplifier even when the output of the high-frequency power is small, thus increasing the power consumption. As shown in FIG. 16 (b), the operating current does not decrease very much when the output of the high-frequency power decreases.

In the case of a portable phone, for example, when it is far from the base station, the electric wave is sent out at the maximum output. Whereas when it is near the station, the electric wave is sent out at a low output. As a result, the waste of the batteries is avoided, making the batteries last longer. However, even when the electric wave is sent out with low high-frequency power near the base station, the same amount of idle current as is needed for the maximum output flows, which consumes the batteries.

In view of these drawbacks of the first conventional high-frequency power amplifier, a high-frequency power amplifier which changes the direct-current bias current in accordance with entered high-frequency power has been proposed in a thesis on page 1,533 in Electronics Letters Vol. 32, No. 17.

The high-frequency power amplifier disclosed in the thesis will be described as a second conventional high-frequency power amplifier as follows with reference to FIG. 17. In FIG. 17, the same components as those of the first conventional high-frequency power amplifier are assigned the same reference numbers, and their description will be omitted. The input impedance matching circuit 1, the inter-stage impedance matching circuit 2, and the output impedance matching circuit 3 are shown in the form of blocks for the sake of convenience. The voltage-current characteristics of the former-stage transistor $Tr_a$ and the latter-stage transistor $Tr_b$ are shown in FIG. 16 (a), in the same manner as those of the first conventional high-frequency power amplifier.

The second conventional high-frequency power amplifier, as shown by a chain line in FIG. 17, comprises a negative bias voltage generation circuit connected with the output terminal of the output impedance matching circuit 3. The negative bias voltage generation circuit comprises a detection circuit for high-frequency power including a resistance $R_1$ and a diode $D_1$, and a voltage division circuit including a negative direct-current bias power supply Vc (-5 V) and division resistances $R_2$, $R_3$, and $R_4$. The negative bias voltage generation circuit detects part of the high-frequency power which is outputted from the output impedance matching circuit 3 at a power detection point E, changes the direct-current bias voltage which is outputted from the negative direct-current bias power supply Vc, based on the detected high-frequency power, and outputs the direct-current bias voltage to the input terminal of the latter-stage transistor $Tr_b$ from a negative bias voltage output point D via the third microstrip line $S_3$.

According to the above-mentioned structure, when the high-frequency power detected at the power detection point E is large, the bias voltage which is outputted from the negative bias voltage output point D increases as high as -1 V, whereas when the high-frequency power detected at the power detection point E is small, the bias voltage which is outputted from the negative bias voltage output point D decreases as low as -5 V. This is how the idle current is reduced when the entered high-frequency power is small. As a result, as shown in FIG. 18, the operating current when the entered high-frequency power is small becomes lower than that in the first conventional high-frequency power amplifier shown in FIG. 16 (b).

However, the second conventional high-frequency power amplifier also has a drawback. The peripheral circuit has a negative direct-current bias power supply $V_c$, and for the negative direct-current bias power supply $V_c$ to generate negative voltage of around -5 V, it is necessary to provide a negative voltage generation circuit which generates negative voltage based on the positive voltage outputted from the positive power supply $+VDD_2$. Since the negative voltage generation circuit is constantly supplied with a current of 10 mA, the second conventional high-frequency power amplifier fails to reduce the current consumption when the entered high-frequency power is small.

SUMMARY OF THE INVENTION

In view of the above-mentioned problems, the object of the present invention is to provide a high-frequency power amplifier which reduces the current consumption to a great extent when entered high-frequency power is small.

In order to achieve the object, in place of a transistor which operates, and whose current-voltage characteristics greatly change, when direct-current negative voltage is supplied on the input terminal (refer to FIG. 16 (a)), the present invention employs a transistor which operates and whose current-voltage characteristics greatly change when positive voltage is supplied on the input terminal (refer to FIG. 13 (a)) as a transistor for high-frequency power. The present invention also outputs a positive voltage which increases or decreases in accordance with an increase or decrease in the detected high-frequency power to the input terminal of the transistor.

A first high-frequency power amplifier of the present invention comprises: a transistor for high-frequency power which operates and whose current-voltage characteristics greatly change when positive voltage is supplied on the input terminal of the transistor; an input bias circuit connected with the input terminal of the transistor; an output bias circuit connected with the output terminal of the transistor; an input impedance matching circuit connected with the input terminal of the transistor; an output impedance matching circuit connected with the output terminal of the transistor; and a positive voltage generation circuit, wherein the positive voltage generation circuit comprises: a detection circuit whose input terminal is connected to the input side or the output side of the transistor and which detects and outputs part of high-frequency power to be entered to the transistor or to be outputted from the transistor; a rectification circuit whose input terminal is connected with the output terminal of the detection circuit and which rectifies the part of the high-frequency power outputted from the detection circuit and outputs pulsating positive voltage; and a smoothing circuit whose input terminal is connected with the output terminal of the rectification circuit and whose output terminal is connected with the input terminal of the input bias circuit and which smoothes the pulsating positive voltage outputted from the rectification circuit and outputs positive voltage. The positive voltage generation circuit outputs positive voltage which increases or decreases in accordance with an increase or decrease of the part of the high-frequency power detected by the detection circuit to the input terminal of the input bias circuit without intervention of a direct-current power supply.

Unlike the second conventional high-frequency power amplifier, the first high-frequency power amplifier of the present invention does not need to provide a negative direct-current bias power supply in the bias voltage generation circuit because it includes the transistor for high-frequency power which operates and whose current-voltage characteristics greatly change when positive voltage is supplied on the input terminal, and also includes the positive voltage generation circuit for outputting positive voltage which increases or decreases in accordance with an increase or decrease in the detected high-frequency power to the input terminal of the transistor for high-frequency power via the input bias circuit, without intervention of a direct-current power supply. Consequently, the negative voltage generation circuit for making the negative direct-current bias power supply generate negative voltage becomes unnecessary. As a result, when the entered high-frequency power is small, the power consumption can be further reduced.

In addition, both the circuit structure of the bias voltage generation circuit and the entire circuit structure are simplified because the negative direct-current bias power supply and the negative voltage generation circuit become unnecessary. Consequently, the high-frequency power amplifier needs less wiring, which results in the miniaturization of the amplifier.

In the first high-frequency power amplifier, it is preferable that the input terminal of the detection circuit is connected with the input terminal of the input impedance matching circuit or the output terminal of the output impedance matching circuit.

This structure enables the input terminal of the detection circuit to be disposed in the vicinity of the external input terminal or the external output terminal of the high-frequency power amplifier, which facilitates the connection in the case where the transistor for the high-frequency power, the input bias circuit, the output bias circuit, the input impedance matching circuit, and output impedance matching circuit are mounted on a semiconductor substrate, and the positive voltage generation circuit is mounted on another semiconductor substrate.

In the first high-frequency power amplifier, it is preferable that the input terminal of the detection circuit is connected with the output terminal of the input impedance matching circuit or the input terminal of the output impedance matching circuit.

This structure can reduce the influence of providing the positive voltage generation circuit on the basic amplification circuit. To be more specific, although the input impedance and the output impedance of the transistor for high-frequency power is usually far lower than 50 Ω, when a resistance having an impedance far larger than 5 Ωis used as the detection circuit of the positive voltage generation circuit, the transistor for high-frequency power can be prevented from being badly affected by the difference in the impedance. Consequently, the design of the input impedance matching circuit or the output impedance matching circuit is simplified because there is no need of considering the influence of the positive voltage generation circuit.

In the first high-frequency power amplifier, it is preferable that the input terminal of the detection circuit is connected with the output bias circuit.

This structure makes it possible to ignore the influence of providing the positive voltage generation circuit on the basic amplification circuit. To be more specific, some high-frequency power leaks in the output bias circuit and can be used for the detection in the detection circuit, so that the basic high-frequency power which flows the amplification circuit is not used for the detection. As a result, there is no need of considering the amount of the high-frequency power which is lost by the detection of the high-frequency power.

In the first high-frequency power amplifier, it is preferable that the rectification circuit is composed of a pair of diodes which are connected in reverse directions and in parallel, and outputs double pulsating positive voltage.

This structure enables the smoothing circuit to enter twice as much as voltage, so that the predetermined positive voltage can be obtained even by halving the absolute value of the high-frequency power to be detected. Consequently, the high-frequency power extracted from the basic amplification circuit can be halved, which results in the reduction of the loss of the high-frequency power flowing in the basic amplification circuit.

In the first high-frequency power amplifier, it is preferable that the smoothing circuit comprises a capacitor and a variable resistance, and outputs positive voltage which changes in accordance with changes in the resistance value of the variable resistance.

According to this structure, even if the current-voltage characteristics of the transistor for high-frequency power greatly change when a current starts to flow towards the transistor, the resistance value of the variable resistance can be adjusted, which can realize a high-frequency power amplifier having gains and outputs that are equivalent from each other.

In the first high-frequency power amplifier, it is preferable that the transistor is either an N-channel MOSFET, an NPN-type bipolar transistor, an N-channel MESFET, or an N-channel heterojunction FET, and has current-voltage characteristics which is a property of a normally-off type, an enhance-mode type, or other similar types.

This structure enables the current-voltage characteristics of these transistors to be greatly changed by supplying positive voltage on their control terminals. Consequently, the idle current can be reduced when the high-frequency power is small, and can increase in accordance with an increase in the positive voltage entered to the control terminals of these transistors when the high-frequency power is large, so that the high-frequency power outputted from these transistors increases. As a result, it becomes possible to reduce the operating current when the high-frequency power entered to the high-frequency power amplifier is small, and to increase the high-frequency power outputted from the high-frequency power amplifier when large high-frequency power is entered thereto.

In the first high-frequency power amplifier, it is preferable that the transistor, the input bias circuit, the output bias circuit, the input impedance matching circuit, the output impedance matching circuit, and the positive voltage generation circuit are formed on the same semiconductor substrate.

This structure realizes a microwave monolithic integrated circuit (MMIC) in a chip having several-millimeter sides by using a gallium-arsenic (GaAs) substrate as a semiconductor substrate. Consequently, positive voltage can be generated on the semiconductor substrate, without drawing the input bias circuit of the transistor for high-frequency power out from the chip. In addition, when the semiconductor substrate is put in a resin package, it becomes unnecessary to draw the lead terminals of the input bias circuit out, which can reduce the number of the lead terminals. As a result, a high-frequency power amplifier which is small and requires no setting of the input bias circuit can be realized.

In the first high-frequency power amplifier, it is preferable that the transistor, the input bias circuit, the output bias circuit, the input impedance matching circuit, and the output impedance matching circuit are formed on the same semiconductor substrate.

This structure enables a high-frequency power amplifier having the existing MMIC to be provided with the positive voltage generation circuit from outside, which can simplify the input bias circuit and miniaturize the entire size of the high-frequency power amplifier.

A second high-frequency power amplifier of the present invention comprises: a former-stage transistor for high-frequency power which operates and whose current-voltage characteristics greatly change when positive voltage is supplied on an input terminal of the former-stage transistor; a first input bias circuit connected with the input terminal of the former-stage transistor; a first output bias circuit connected with the output terminal of the former-stage transistor; a first input impedance matching circuit connected with the input terminal of the former-stage transistor; a first output impedance matching circuit connected with the output terminal of the former-stage transistor; a latter-stage transistor for high-frequency power which operates and whose current-voltage characteristics greatly change when positive voltage is supplied on the input terminal of the a latter-stage transistor; a second input bias circuit connected with the input terminal of the latter-stage transistor; a second output bias circuit connected with the output terminal of the latter-stage transistor; a second input impedance matching circuit connected with the input terminal of the latter-stage transistor; a second output impedance matching circuit connected with the output terminal of the latter-stage transistor; and a positive voltage generation circuit, wherein the positive voltage generation circuit comprises: a detection circuit whose input terminal is connected to the input side or the output side of the latter-stage transistor and which detects and outputs part of high-frequency power to be entered to the latter-stage transistor or to be outputted from the latter-stage transistor; a rectification circuit whose input terminal is connected with the output terminal of the detection circuit and which rectifies the part of the high-frequency power outputted from the detection circuit and outputs a pulsating positive voltage; and a smoothing circuit whose input terminal is connected with the output terminal of the rectification circuit and whose output terminal is connected with each input terminal of the first input bias circuit and the second input bias circuit, and which smoothes the pulsating positive voltage outputted from the rectification circuit and outputs a positive voltage. The positive voltage generation circuit outputs positive voltage which increases or decreases in accordance with an increase or decrease in the part of the high-frequency power detected by the detection circuit to each input terminal of the first input bias circuit and the second input bias circuit without intervention of a direct-current power supply.

According to the second high-frequency power amplifier of the present invention, the positive voltage, which increases or decreases in accordance with an increase or decrease in the detected high-frequency power, is entered to each input terminal of the former-stage and latter-stage transistors for high-frequency power from the positive voltage generation circuit. As a result, when the entered high-frequency power is small, the total current consumption can be greatly reduced.

Furthermore, unlike the second conventional high-frequency power amplifier and similar to the first high-frequency power amplifier of the present invention, the second high-frequency power amplifier of the present invention does not need to provide a negative direct-current bias power supply in the bias voltage generation circuit. Consequently, the negative voltage generation circuit for making the negative direct-current bias power supply generate negative voltage becomes unnecessary. As a result, when the entered high-frequency power is small, the power consumption can be further reduced.

Furthermore, similar to the first high-frequency power amplifier of the present invention, both the circuit structure of the negative voltage generation circuit and the entire circuit structure are simplified because the negative direct-current bias power supply and the bias voltage generation circuit become unnecessary. Consequently, the high-frequency power amplifier needs less wiring, which results in the miniaturization of the amplifier.

In the second high-frequency power amplifier, it is preferable that the rectification circuit is composed of a pair of diodes which are connected in reverse directions and in parallel, and outputs double pulsating positive voltage.

This structure enables the smoothing circuit to enter twice as much as voltage, so that the predetermined positive voltage can be obtained even by halving the absolute value of the high-frequency power to be detected. Consequently, the high-frequency power extracted from the basic amplification circuit can be halved, which results in the reduction of the loss of the high-frequency power flowing in the basic amplification circuit.

In the second high-frequency power amplifier, it is preferable that the smoothing circuit comprises a voltage division circuit which divides positive voltage into first positive voltage and second positive voltage, and outputs the first positive voltage and the second positive voltage to the input terminal of the first input bias circuit and the input terminal of the second input bias circuit, respectively.

This structure makes it possible to supply the former-stage transistor and the latter-stage transistor with different input bias voltages from each other, even if there is a difference in current-voltage characteristics between these transistors. Consequently, the idle currents of these transistors can be adjusted separately in accordance with the high-frequency power, which further reduces the idle current.

In the second high-frequency power amplifier, it is preferable that the voltage division circuit is composed of a plurality of division resistances including at least one variable resistance, and outputs the first positive voltage or the second positive voltage which changes in accordance with changes in a resistance value of the at least one variable resistance.

According to this structure, even if the current-voltage characteristics of the former-stage and latter-stage transistors for high-frequency power greatly change when a current starts to flow towards these transistors, the resistance value of the variable resistance can be adjusted, which can realize a high-frequency power amplifier having gains and outputs that are equivalent to each other.

In the second high-frequency power amplifier, it is preferable that each of the former-stage transistor and the latter-stage transistor is either an N-channel MOSFET, an NPN-type bipolar transistor, an N-channel MESFET, or an N-channel heterojunction FET, and has current-voltage characteristics which is a property of a normally-off type, an enhance-mode type, or other similar types.

According to this structure, similar to the first high-frequency power amplifier of the present invention, it becomes possible to reduce the operating current when the high-frequency power entered in to the high-frequency power amplifier is small, and to increase the high-frequency power outputted from the high-frequency power amplifier when large high-frequency power is entered thereto.

In the second high-frequency power amplifier, it is preferable that the former-stage transistor, the first input bias circuit, the first output bias circuit, the first input impedance matching circuit, the first output impedance matching circuit, the latter-stage transistor, the second input bias circuit, the second output bias circuit, the second input impedance matching circuit, the second output impedance matching circuit, and the positive voltage generation circuit are formed on the same semiconductor substrate.

Similar to the first high-frequency power amplifier of the present invention, this structure enables positive voltage to be generated on the semiconductor substrate, without drawing the input bias circuit of the transistor for high-frequency power out from the chip. In addition, when the semiconductor substrate is put in a resin package, it becomes unnecessary to draw the lead terminals of the input bias circuit out, which can reduce the number of the lead terminals. As a result, a high-frequency power amplifier which is small and requires no setting of the input bias circuit can be realized.

In the second high-frequency power amplifier, it is preferable that the former-stage transistor, the first input bias circuit, the first output bias circuit, the first input impedance matching circuit, the first output impedance matching circuit, the latter-stage transistor, the second input bias circuit, the second output bias circuit, the second input impedance matching circuit, and the second output impedance matching circuit are formed on the same semiconductor substrate.

Similar to the first high-frequency power amplifier of the present invention, this structure can simplify the input bias circuit and miniaturize the entire high-frequency power amplifier.

DETAILED DESCRIPTION OF THE INVENTION

The high-frequency power amplifier of each embodiment of the present invention will be described as follows with reference to the drawings.

(EMBODIMENT 1)

Figure 1:
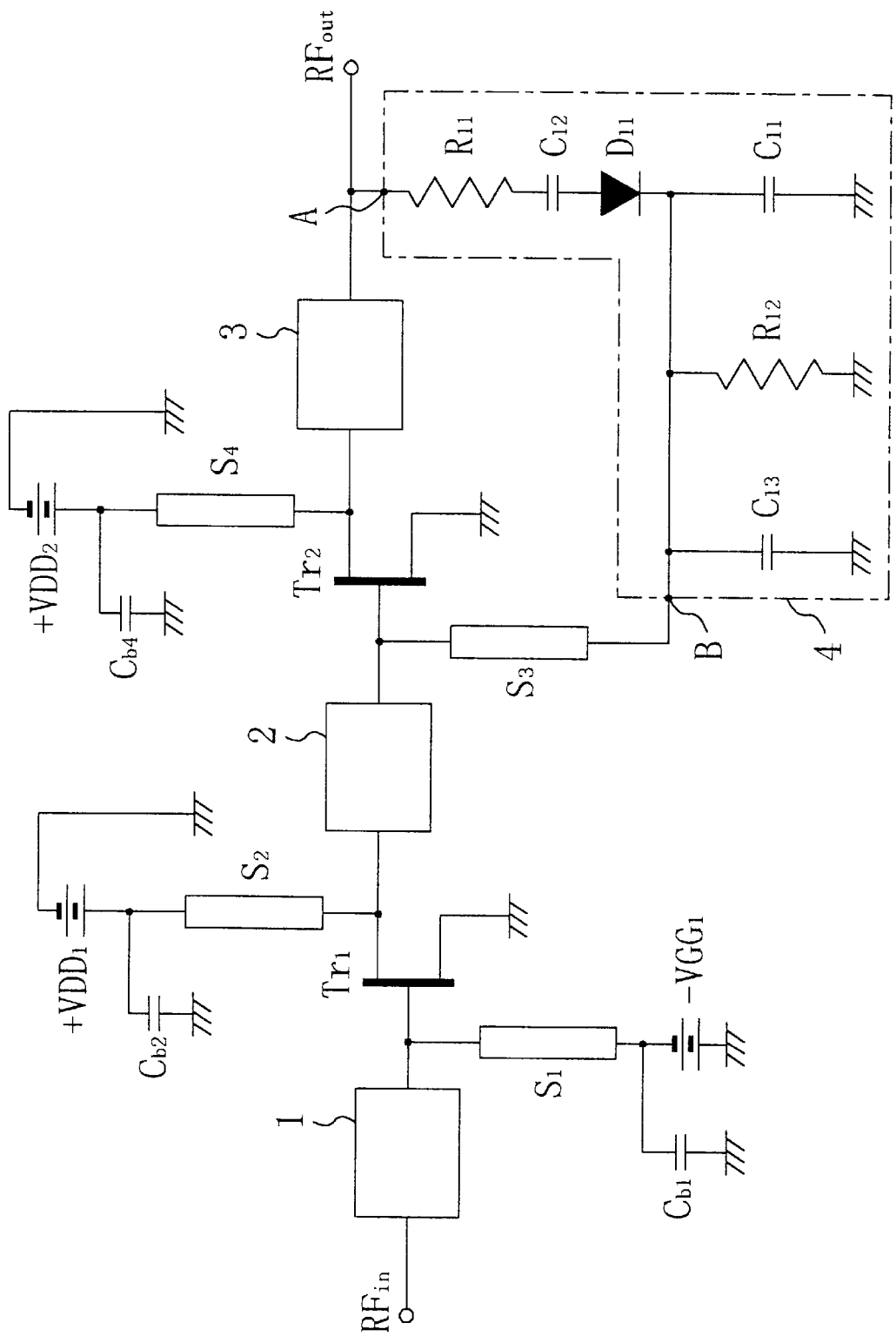
FIG. 1 shows the circuit diagram of the high-frequency power amplifier of a first embodiment of the present invention, which illustrates a positive voltage generation circuit.
Figure 2:
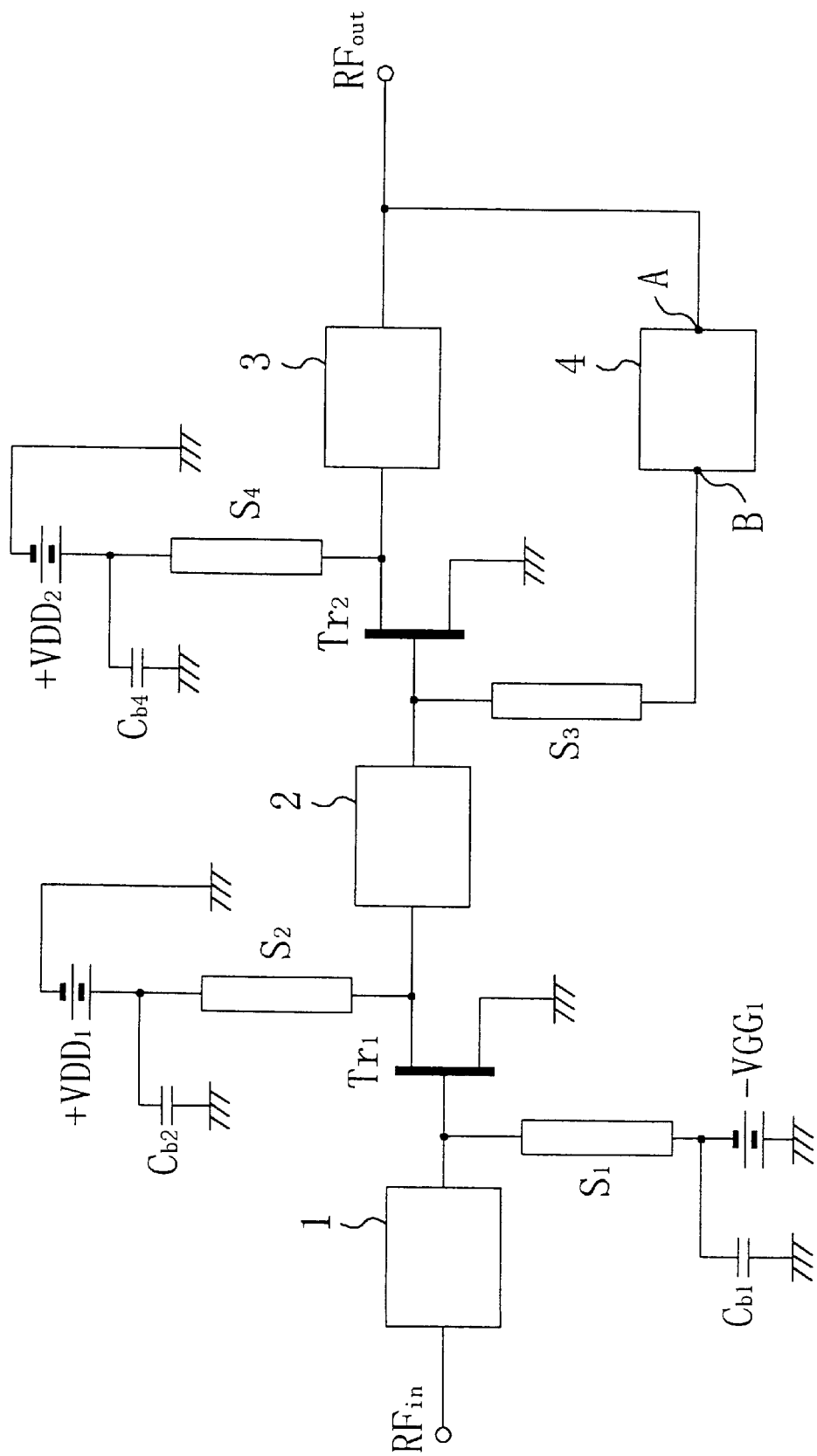
FIG. 2 shows the circuit diagram of the high-frequency power amplifier of the first embodiment of the present invention, which shows the positive voltage generation circuit in the form of a block diagram.
Figure 13A:
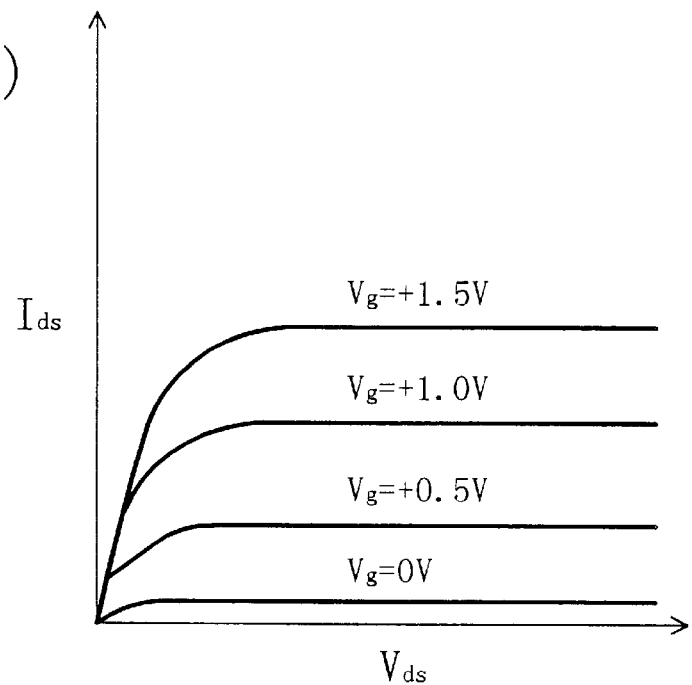
FIG. 13 ($a$) shows the current-voltage characteristics of a transistor for high-frequency power in the high-frequency power amplifier of each embodiment of the present invention, and FIG. 13 ($b$) shows the input-output characteristics of the high-frequency power and the operating current of the latter-stage transistor for high-frequency power in the high-frequency power amplifier of the first embodiment of the present invention.
Figure 13B:
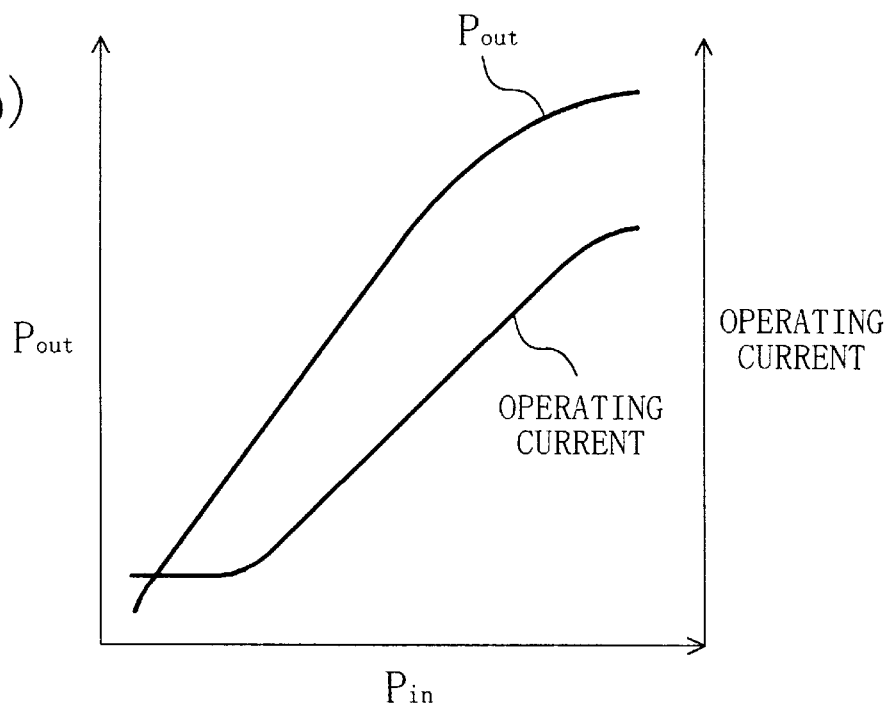

The high-frequency power amplifier of a first embodiment of the present invention will be described as follows with reference to FIGS. 1, 2, 13 (a), and 13 (b). FIGS. 1 and 2 each shows the circuit structure of the high-frequency power amplifier of the first embodiment: FIG. 1 shows a circuit diagram which details a positive voltage generation circuit 4, and FIG. 2 shows a circuit diagram where the positive voltage generation circuit 4 is shown in the form of a block. FIG. 13 (a) shows the current-voltage characteristics of the former-stage and latter-stage transistors for high-frequency power, and FIG. 13 (b) shows the power consumption of the high-frequency power amplifier of the first embodiment. In FIGS. 1 and 2, the same components as those of the first conventional high-frequency power amplifier will be assigned the same reference numbers, and their description will be omitted.

As shown in FIG. 13 (a), in the former-stage transistor $Tr_1$ for high-frequency power and the latter-stage transistor $Tr_2$ for high-frequency power in the first embodiment, the current-voltage characteristics greatly change when positive voltage is supplied on the input terminal, which is a property of a normally-off type, an enhance-mode type, or other similar types. This property indicates that no or slight current flows when the voltage to be supplied on the input terminal is close to 0 V, whereas more and more current flows as the voltage to be supplied on the input terminal grows towards the positive voltage from around 0 V. To be more specific, each of the transistors $Tr_1$ and $Tr_2$ is composed of an N channel MOSFET, an NPN-type bipolar transistor, an N-channel MESFET, or an N-channel heterojunction FET.

As shown in FIG. 1, the high-frequency power amplifier of the first embodiment comprises the former-stage transistor $Tr_1$ for high-frequency power, a latter-stage transistor $Tr_2$ for high-frequency power, a first microstrip line $S_1$ having a ¼ wavelength as a first input bias circuit connected with the input terminal of the former-stage transistor $Tr_1$, a second microstrip line $S_2$ having a ¼ wavelength as a first output bias circuit connected with the output terminal of the former-stage transistor $Tr_1$, a third microstrip line $S_3$ having a ¼ wavelength as a second input bias circuit connected with the input terminal of the latter-stage transistor $Tr_2$, a fourth microstrip line $S_4$ having a ¼ wavelength as a second output bias circuit connected with the output terminal of the latter-stage transistor $Tr_2$, an input impedance matching circuit 1 connected with the input terminal of the former-stage transistor $Tr_1$, an interstage impedance matching circuit 2 connected between the output terminal of the former-stage transistor $Tr_1$ and the output terminal of the latter-stage transistor $Tr_2$, and an output impedance matching circuit 3 connected with the output terminal of the latter-stage transistor $Tr_2$ The interstage impedance matching circuit 2, which performs an impedance matching between the former-stage transistor $Tr_1$ and the latter-stage transistor $Tr_2$ in a multistage high-frequency power amplifier having two transistors for high-frequency power, has a function as an output impedance matching circuit for the former-stage transistor $Tr_1$, and a function as an input impedance matching circuit for the latter-stage transistor $Tr_2$.

As a feature of the first embodiment, a positive voltage generation circuit 4 is provided which generates positive voltage that increases or decreases in accordance with an increase or decrease in the entered high-frequency power, and whose input unit and output unit are provided with a power detection point A and a positive voltage output point B, respectively. As shown in FIG. 1, the positive voltage generation circuit 4 comprises a resistance $R_{11}$ (a detection circuit) which detects part of the entered high-frequency power, a capacitor $C_{12}$ which eliminates a direct-current component from the detected high-frequency power and outputs minute high-frequency power, a diode $D_{11}$ (a rectification circuit) which rectifies the minute high-frequency power outputted from the diode $D_{11}$ and outputs pulsating positive voltage, and a capacitor $C_{11}$ and a resistance $R_{12}$ (a smoothing circuit) which smooth the pulsating positive voltage outputted from the diode $D_{11}$ and output positive voltage. As apparent from FIG. 1. the positive voltage generation circuit 4 does not have a negative direct-current bias power supply.

The detection circuit for detecting part of the entered high-frequency power corresponds to the resistance $R_{11}$ in the first embodiment; however, it can be composed of either a diode only or a diode and a resistance which are connected in series. A capacitor $C_{13}$ is provided in order to reduce the high-frequency noise of the positive voltage.

As another feature of the first embodiment, the power detection point A and the positive voltage output point B in the positive voltage generation circuit 4 are connected with the output terminal of the output impedance matching circuit 3 and the input terminal of the third microstrip line $S_3$ (the first input bias circuit), respectively. Thus, the positive voltage generation circuit 4 detects part of the high-frequency power outputted from the output impedance matching circuit 3, outputs positive voltage which increases or decreases in accordance with an increase or decrease in the detected high-frequency power to the input terminal of the latter-stage transistor $Tr_2$ via the third microstrip line $S_3$.

Consequently, according to the first embodiment, the input terminal of the latter-stage transistor $Tr_2$ for high-frequency power is supplied high positive voltage when the high-frequency power outputted from the output impedance matching circuit 3 is large, and is supplied low positive voltage when the high-frequency power outputted from the output impedance matching circuit 3 is small.

In addition, since the positive voltage generation circuit 4 does not have a negative direct-current bias power supply, a negative voltage generation circuit for generating negative voltage based on the positive voltage outputted from the positive power supply $+VDD_2$ becomes unnecessary.

FIG. 13 (b) shows the input-output characteristics ($P_{out}$) of the high-frequency power of the high-frequency power amplifier and the operating current of the latter-stage transistor $Tr_2$ for high-frequency power. As shown in FIG. 13 (b), the operating current decreases as the outputted high-frequency power becomes small.

Also according to the first embodiment, the circuit structure is simplified because the power detection point A in the positive voltage generation circuit 4 is connected with the output terminal of the output impedance matching circuit 3. However, since the output impedance matching circuit 3 increases the impedance of the high-frequency power as high as 50 Ω, the entire circuit structure must be designed by taking the influence of providing the positive voltage generation circuit 4 into account.

(EMBODIMENT 2)

Figure 3:
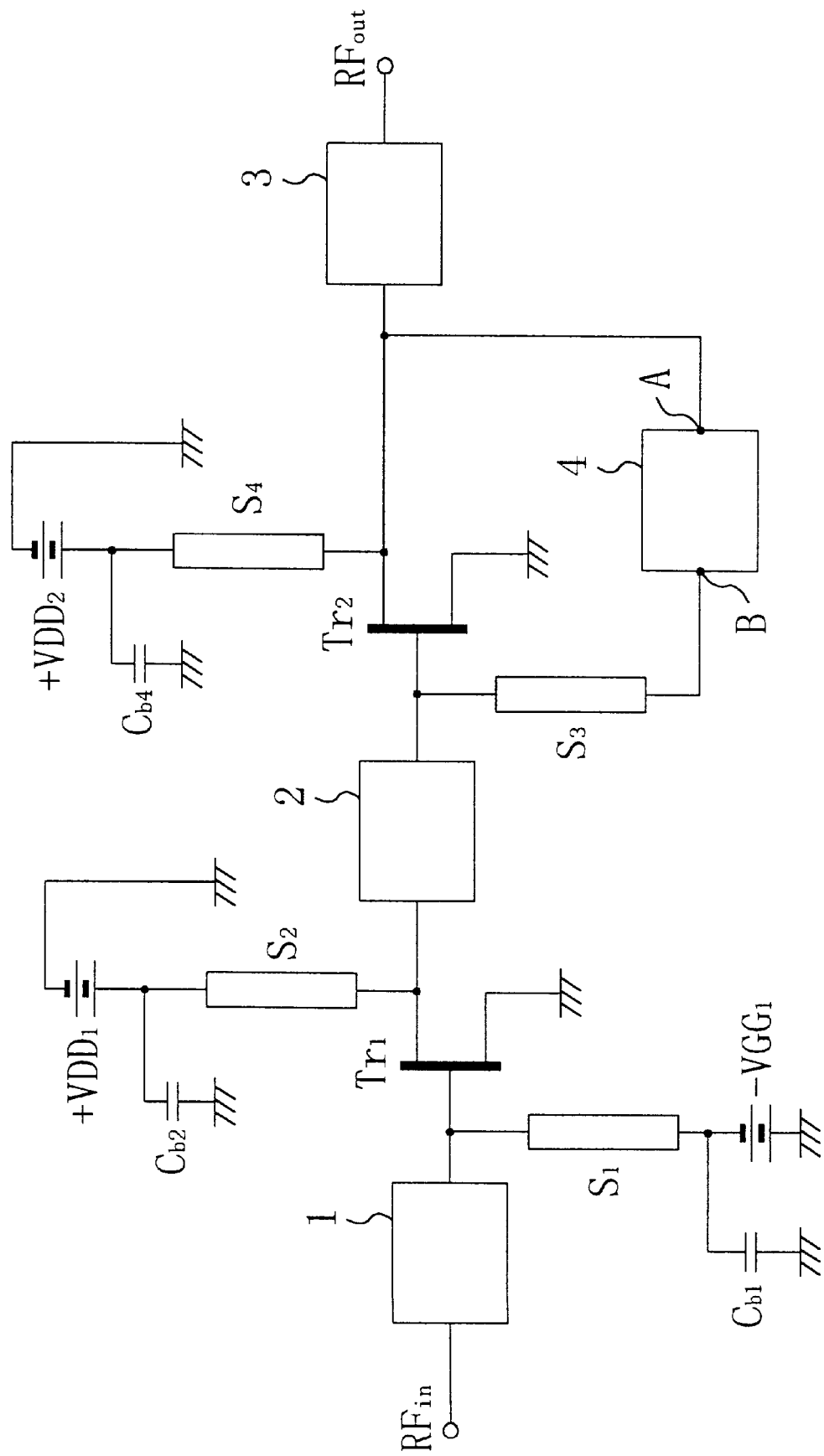
FIG. 3 shows the circuit diagram of the high-frequency power amplifier of a second embodiment of the present invention.
Figure 15:
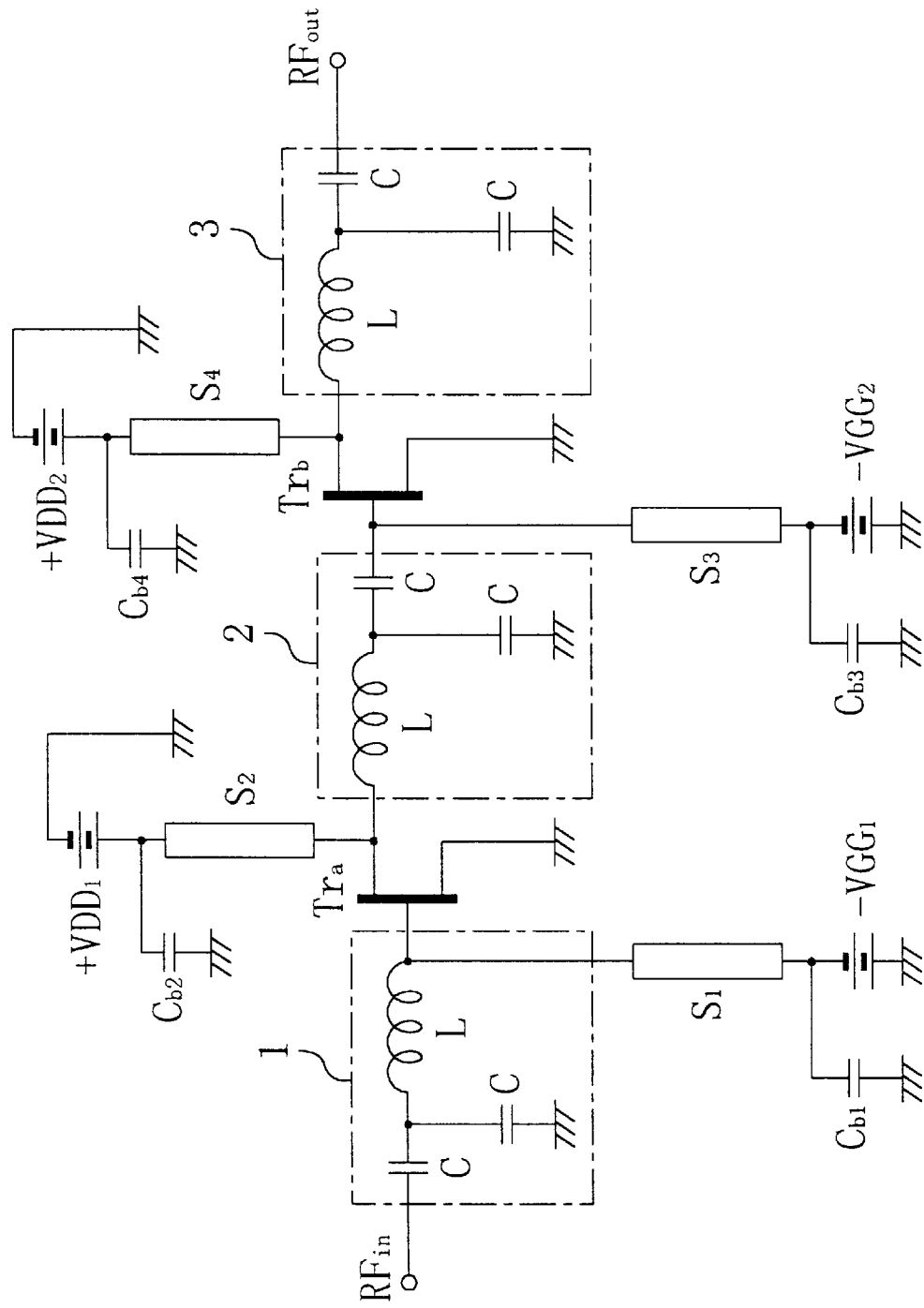
FIG. 15 shows the circuit diagram of a first conventional high-frequency power amplifier.
Figure 16A:
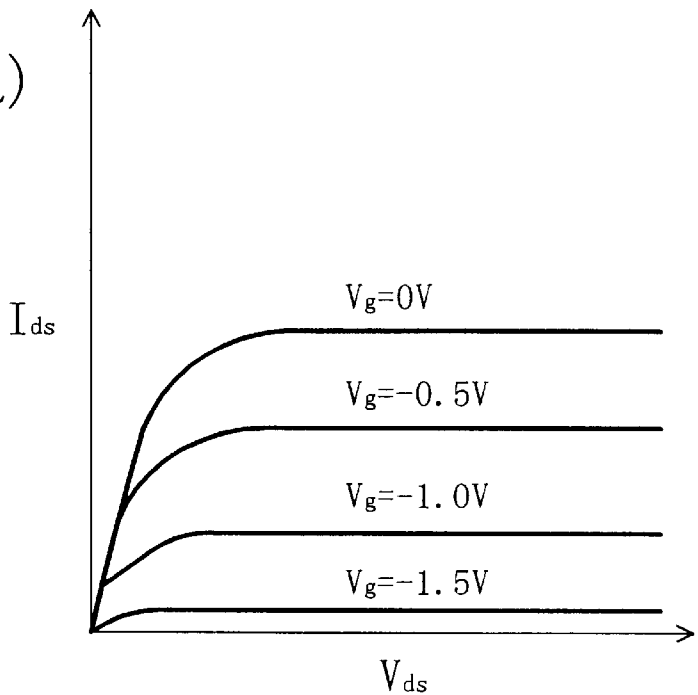
FIG. 16 ($a$) shows the current-voltage characteristics of a transistor for high-frequency power in the first conventional high-frequency power amplifier, and FIG. 16 ($b$) shows the input-output characteristics of the high-frequency power and the operating current of the latter-stage transistor for high-frequency power in the first conventional high-frequency power amplifier.
Figure 16B:
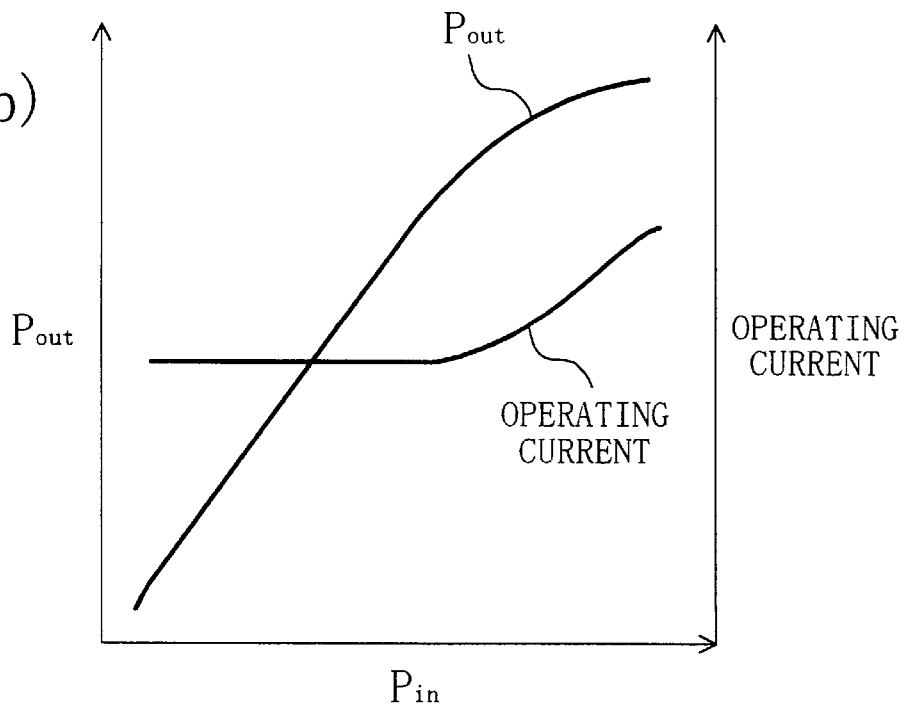
Figure 17:
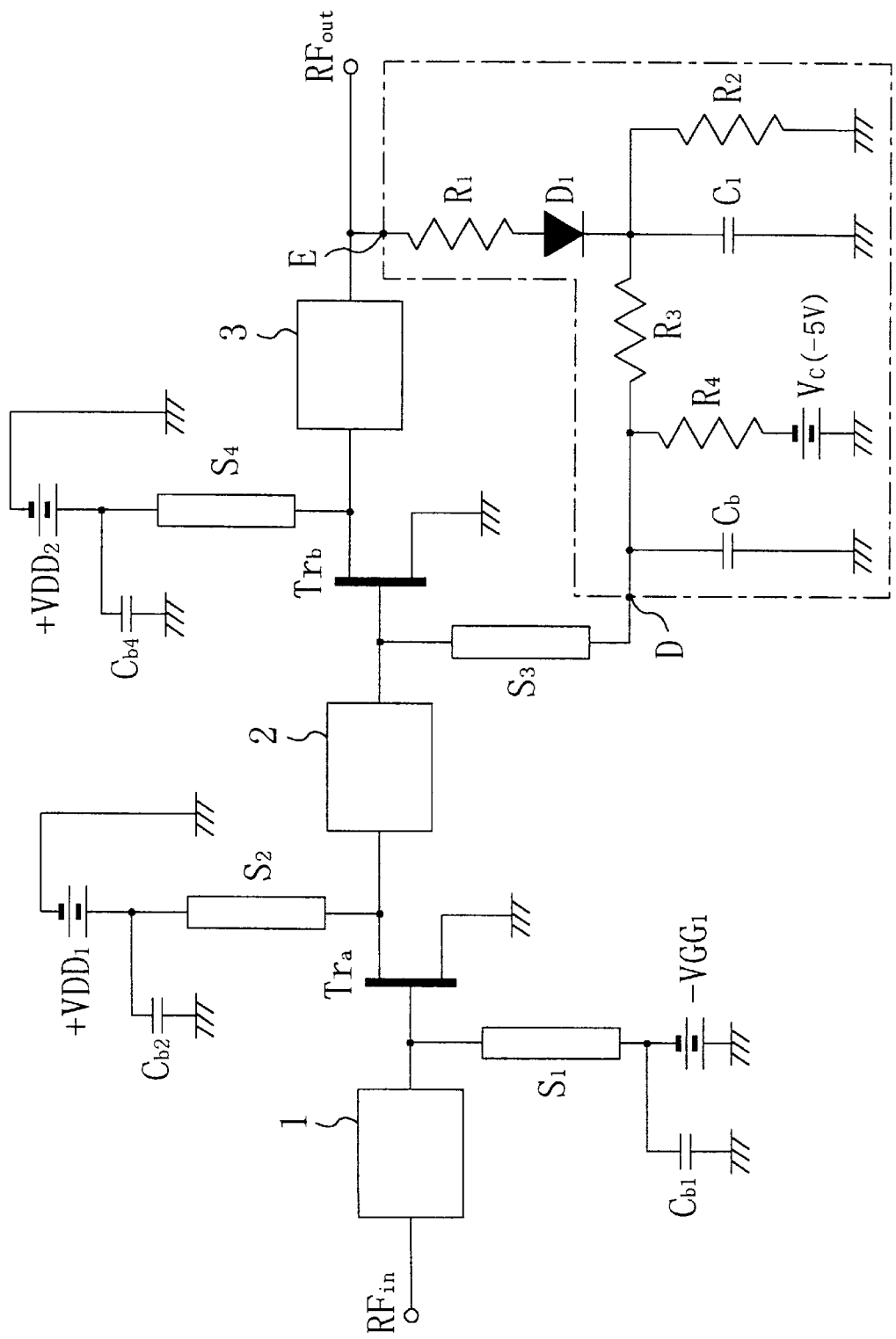
FIG. 17 shows the circuit diagram of a second conventional high-frequency power amplifier.
Figure 18:
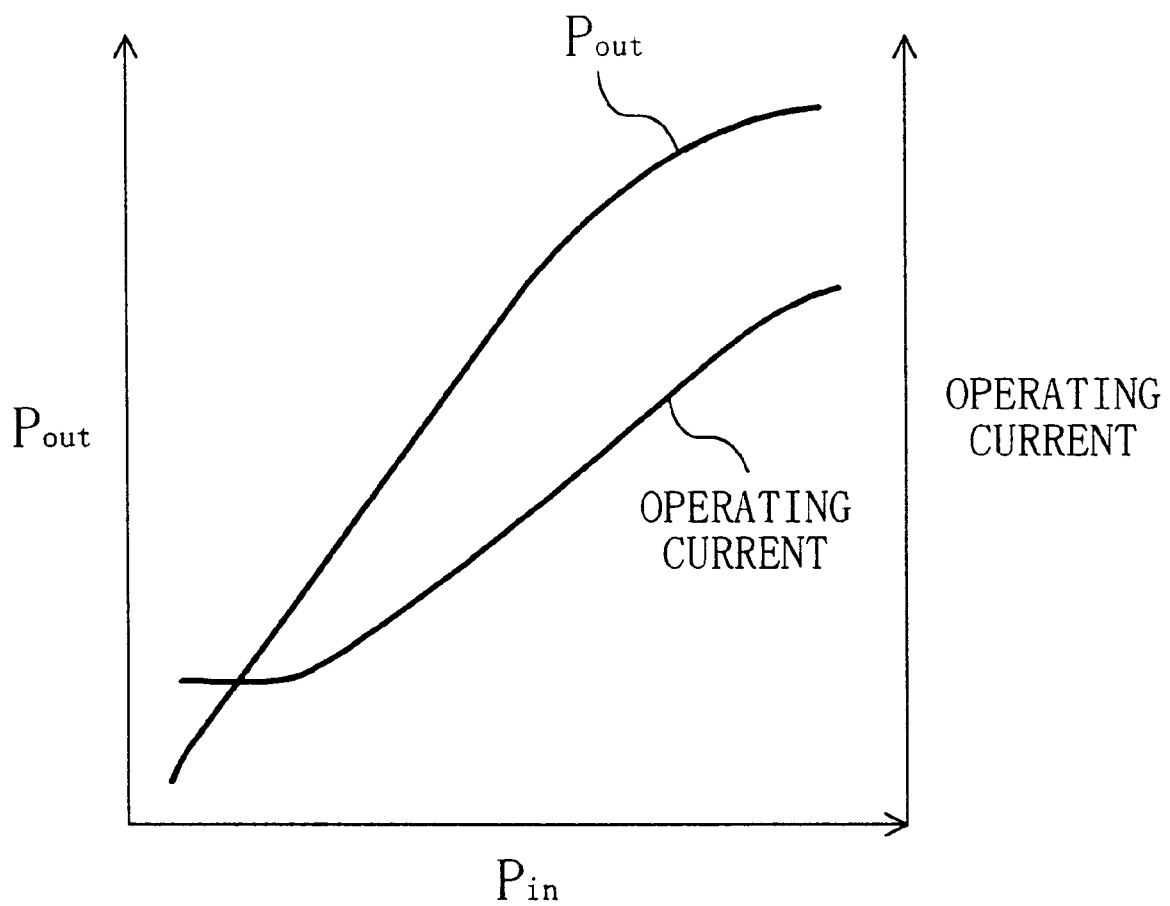
FIG. 18 shows the input-output characteristics of the high-frequency power and the operating current of the latter-stage transistor for high-frequency power in the second conventional high-frequency power amplifier.

The high-frequency power amplifier of a second embodiment of the present invention will be described as follows with reference to FIG. 3. FIG. 3 shows the circuit structure of the high-frequency power amplifier of the second embodiment, where the same components as those of the first conventional high-frequency power amplifier shown in FIG. 15, or as those of the first embodiment shown in FIG. 1, are assigned the same reference numbers, and their description will be omitted.

As a feature of the second embodiment, the power detection point A and the positive voltage output point B in the positive voltage generation circuit 4 are connected with the output terminal of the latter-stage transistor $Tr_2$ for high-frequency power and the input terminal of the third microstrip line $S_3$, respectively.

Consequently, the positive voltage generation circuit 4 detects part of the high-frequency power outputted from the former-stage transistor $Tr_1$ for high-frequency power, and outputs positive voltage which increases or decreases in accordance with an increase or decrease in the detected high-frequency power to the input terminal of the latter-stage transistor $Tr_2$ via the third microstrip line $S_3$.

Thus, according to the second embodiment, the input terminal of the latter-stage transistor $Tr_2$ for high-frequency power is supplied high positive voltage and low positive voltage when the high-frequency power outputted from the latter-stage transistor $Tr_2$ is large and small, respectively.

As another feature of the second embodiment, since the power detection point A in the positive voltage generation circuit 4 is connected with the output terminal of the latter-stage transistor $Tr_2$ for high-frequency power, the entered high-frequency power has a lower impedance than in the first embodiment. As a result, there is no need of considering the influence of the impedance in designing the high-frequency power amplifier.

(EMBODIMENT 3)

Figure 4:
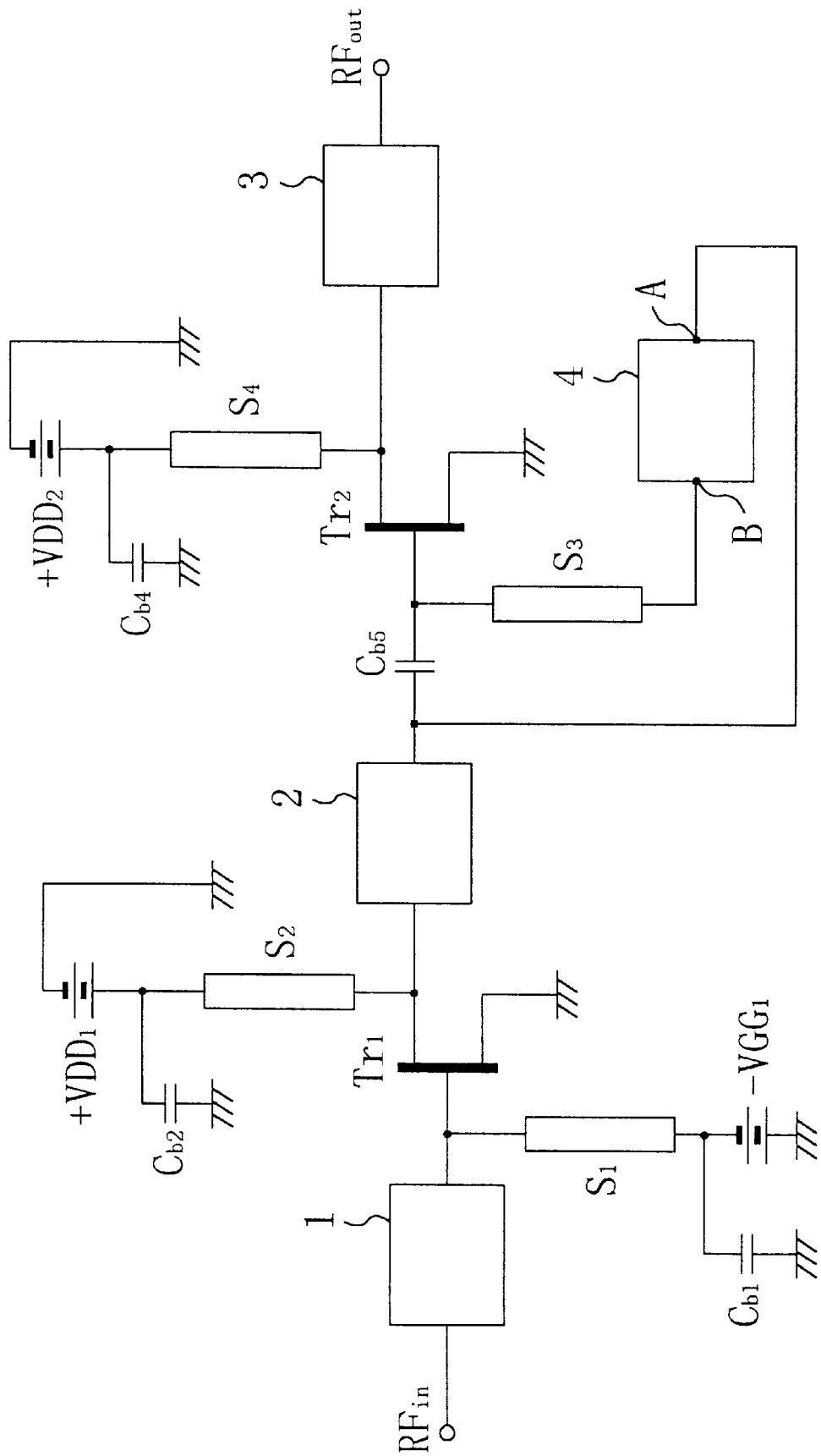
FIG. 4 shows the circuit diagram of the high-frequency power amplifier of a third embodiment of the present invention.

The high-frequency power amplifier of a third embodiment of the present invention will be described as follows with reference to FIG. 4. FIG. 4 shows the circuit structure of the high-frequency power amplifier of the third embodiment, where the same components as those of the first conventional high-frequency power amplifier shown in FIG. 15, or as those of the first embodiment shown in FIG. 1, are assigned the same reference numbers, and their description will be omitted.

As a feature of the third embodiment, the power detection point A in the positive voltage generation circuit 4 is disposed between the output terminal of the interstage impedance matching circuit 2 and the input terminal of the latter-stage transistor $Tr_2$ for high-frequency power, whereas the positive voltage output point B is connected with the input terminal of the third microstrip line $S_3$.

Consequently, the positive voltage generation circuit 4 detects part of the high-frequency power outputted from the latter-stage transistor $Tr_2$ for high-frequency power, and outputs positive voltage which increases or decreases in accordance with an increase or decrease in the detected high-frequency power to the input terminal of the latter-stage transistor $Tr_2$ via the third microstrip line $S_3$. In FIG. 4, $C_{b5}$ represents a capacitor for eliminating a direct-current component from the high-frequency power outputted from the interstage impedance matching circuit 2.

Thus, according to the third embodiment, the input terminal of the latter-stage transistor $Tr_2$ for high-frequency power is supplied high positive voltage and low positive voltage when the high-frequency power outputted from the latter-stage transistor $Tr_2$ is large and small, respectively.

(EMBODIMENT 4)

Figure 5:
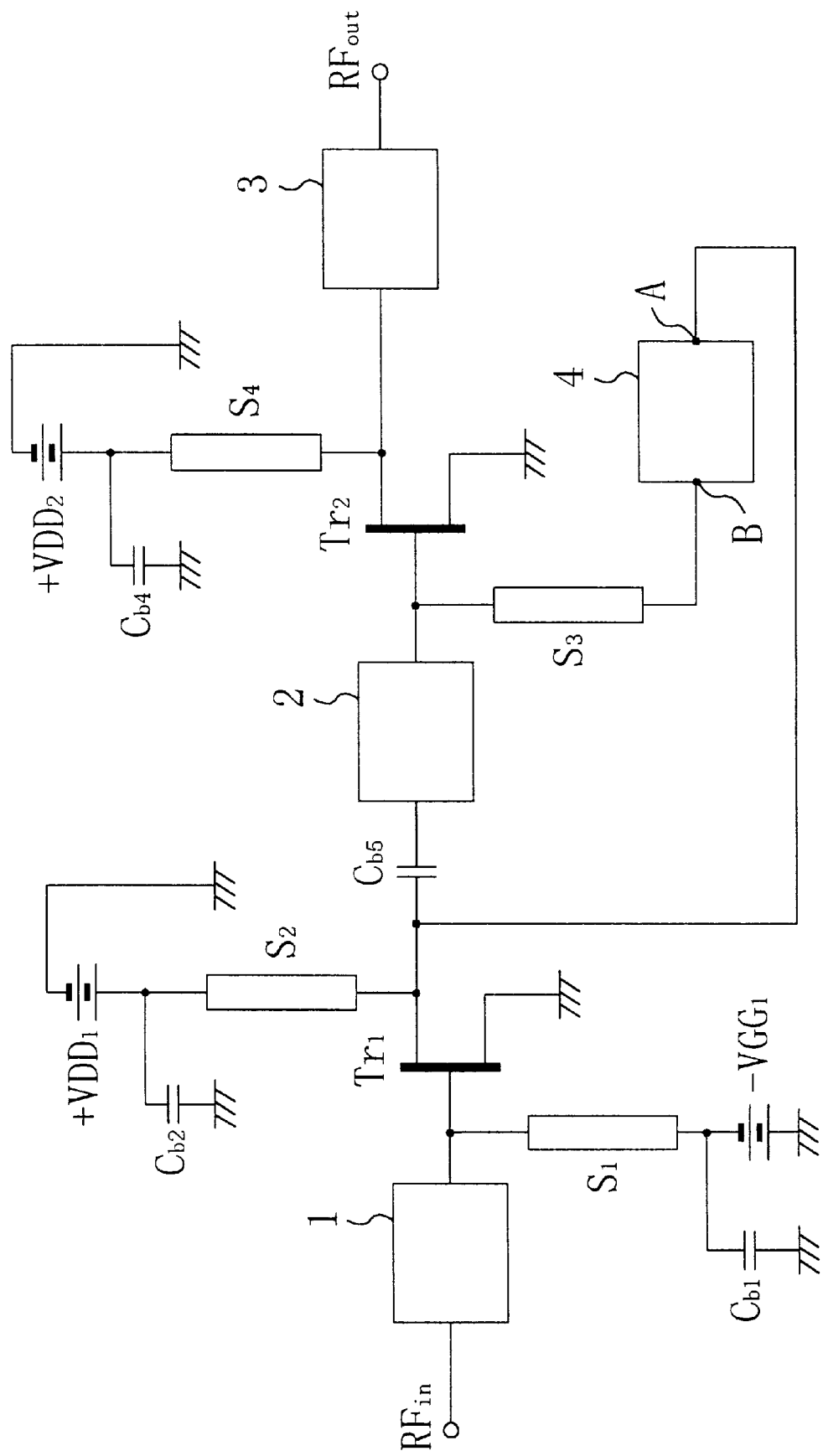
FIG. 5 shows the circuit diagram of the high-frequency power amplifier of a fourth embodiment of the present invention.

The high-frequency power amplifier of a fourth embodiment of the present invention will be described as follows with reference to FIG. 5. FIG. 5 shows the circuit structure of the high-frequency power amplifier of the fourth embodiment, where the same components as those of the first conventional high-frequency power amplifier shown in FIG. 15, or as those of the first embodiment shown in FIG. 1, are assigned the same reference numbers, and their description will be omitted.

As a feature of the fourth embodiment, the power detection point A in the positive voltage generation circuit 4 is disposed between the output terminal of the former-stage transistor $Tr_1$ for high-frequency power and the input terminal of the interstage impedance matching circuit 2, whereas the positive voltage output point B is connected with the input terminal of the third microstrip line $S_3$.

Consequently, the positive voltage generation circuit 4 detects part of the high-frequency power outputted from the latter-stage transistor $Tr_2$ for high-frequency power, and outputs positive voltage which increases or decreases in accordance with an increase or decrease in the detected high-frequency power to the input terminal of the latter-stage transistor $Tr_2$ via the third microstrip line $S_3$.

Thus, according to the fourth embodiment, the input terminal of the latter-stage transistor $Tr_2$ for high-frequency power is supplied high positive voltage and low positive voltage when the high-frequency power outputted from the latter-stage transistor $Tr_2$ is large and small, respectively.

(EMBODIMENT 5)

Figure 6:
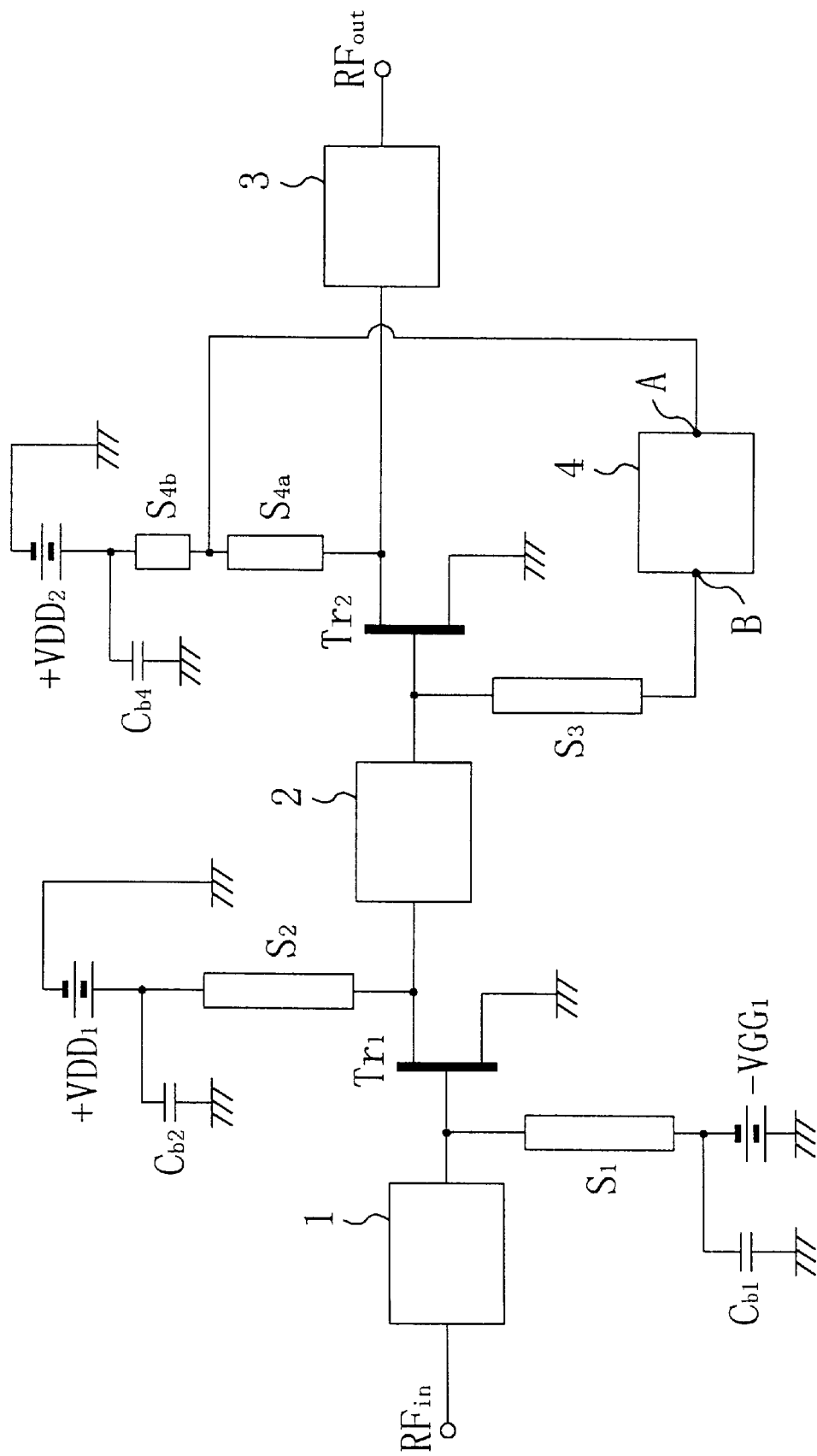
FIG. 6 shows the circuit diagram of the high-frequency power amplifier of a fifth embodiment of the present invention.

The high-frequency power amplifier of a fifth embodiment of the present invention will be described as follows with reference to FIG. 6. FIG. 6 shows the circuit structure of the high-frequency power amplifier of the fifth embodiment, where the same components as those of the first conventional high-frequency power amplifier shown in FIG. 15, or as those of the first embodiment shown in FIG. 1, are assigned the same reference numbers, and their description will be omitted.

As a feature of the fifth embodiment, the power detection point A in the positive voltage generation circuit 4 is connected between two division microstrip lines $S_{4a}$ and $S_{4b}$, which compose the fourth microstrip line $S_4$ connected with the output terminal of the latter-stage transistor $Tr_2$, whereas the positive voltage output point B is connected with the input terminal of the third microstrip line $S_3$.

Consequently, the positive voltage generation circuit 4 detects part of the high-frequency power outputted from the latter-stage transistor $Tr_2$ for high-frequency power, and outputs positive voltage which increases or decreases in accordance with an increase or decrease in the detected high-frequency power to the input terminal of the latter-stage transistor $Tr_2$ via the third microstrip line $S_3$.

Thus, according to the fifth embodiment, the input terminal of the latter-stage transistor $Tr_2$ for high-frequency power is supplied high positive voltage or low positive voltage when the high-frequency power outputted from the latter-stage transistor $Tr_2$ is large or small, respectively.

Another feature of the fifth embodiment, the power detection point A is connected to the middle of the fourth microstrip line $S_4$ as the fourth output bias circuit, that is, the power detection point A detects part of the high-frequency power which leaks in the fourth output bias circuit. Consequently, there is no need of considering the amount of the high-frequency power that is lost due to the detection, which can simplify the design of the basic amplification circuit.

(EMBODIMENT 6)

Figure 7:
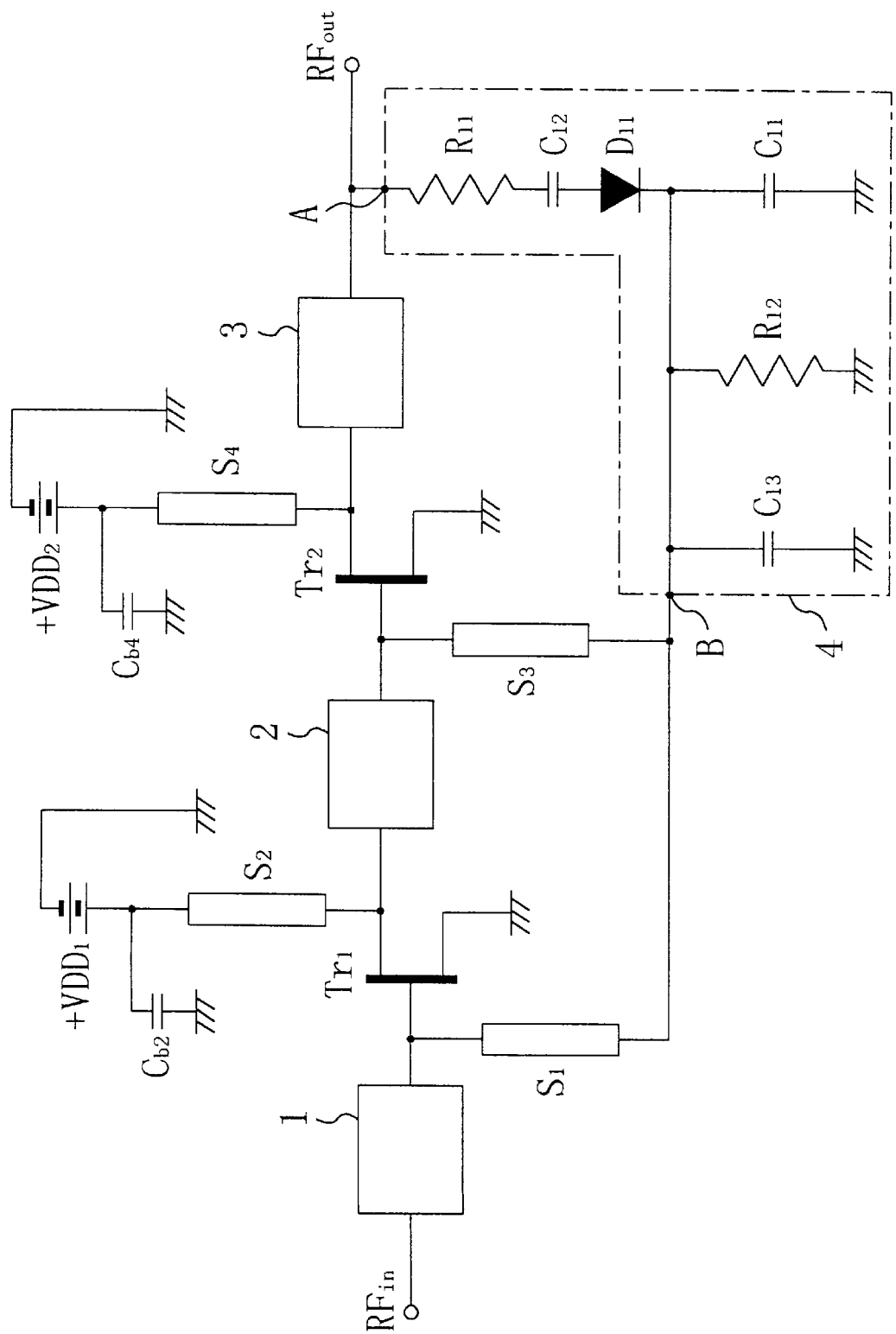
FIG. 7 shows the circuit diagram of the high-frequency power amplifier of a sixth embodiment of the present invention.

The high-frequency power amplifier of a sixth embodiment of the present invention will be described as follows with reference to FIG. 7. FIG. 7 shows the circuit structure of the high-frequency power amplifier of the sixth embodiment, where the same components as those of the first conventional high-frequency power amplifier shown in FIG. 15, or as those of the first embodiment shown in FIG. 1, are assigned the same reference numbers, and their description will be omitted.

As a feature of the sixth embodiment, the power detection point A in the positive voltage generation circuit 4 is connected with the output terminal of the output impedance matching circuit 3, whereas the positive voltage output point B is connected with each input terminal of the first microstrip line $S_1$ and the third microstrip line $S_3$.

Consequently, the positive voltage generation circuit 4 detects part of the high-frequency power outputted from the output impedance matching circuit 3, and outputs positive voltage which increases or decreases in accordance with an increase or decrease in the detected high-frequency power to the input terminal of the former-stage transistor $Tr_1$ via the first microstrip line $S_1$ and to the input terminal of the latter-stage transistor $Tr_2$ via the third microstrip line $S_3$.

Thus, according to the sixth embodiment, each input terminal of the former-stage and latter-stage transistors $Tr_1$ and $Tr_2$ for high-frequency power is supplied high positive voltage or low positive voltage when the high-frequency power outputted from the output impedance matching circuit 3 is large or small, respectively. As a result, the former-stage and latter-stage transistors $Tr_1$ and $Tr_2$ for high-frequency power have less idle current.

Figure 14:
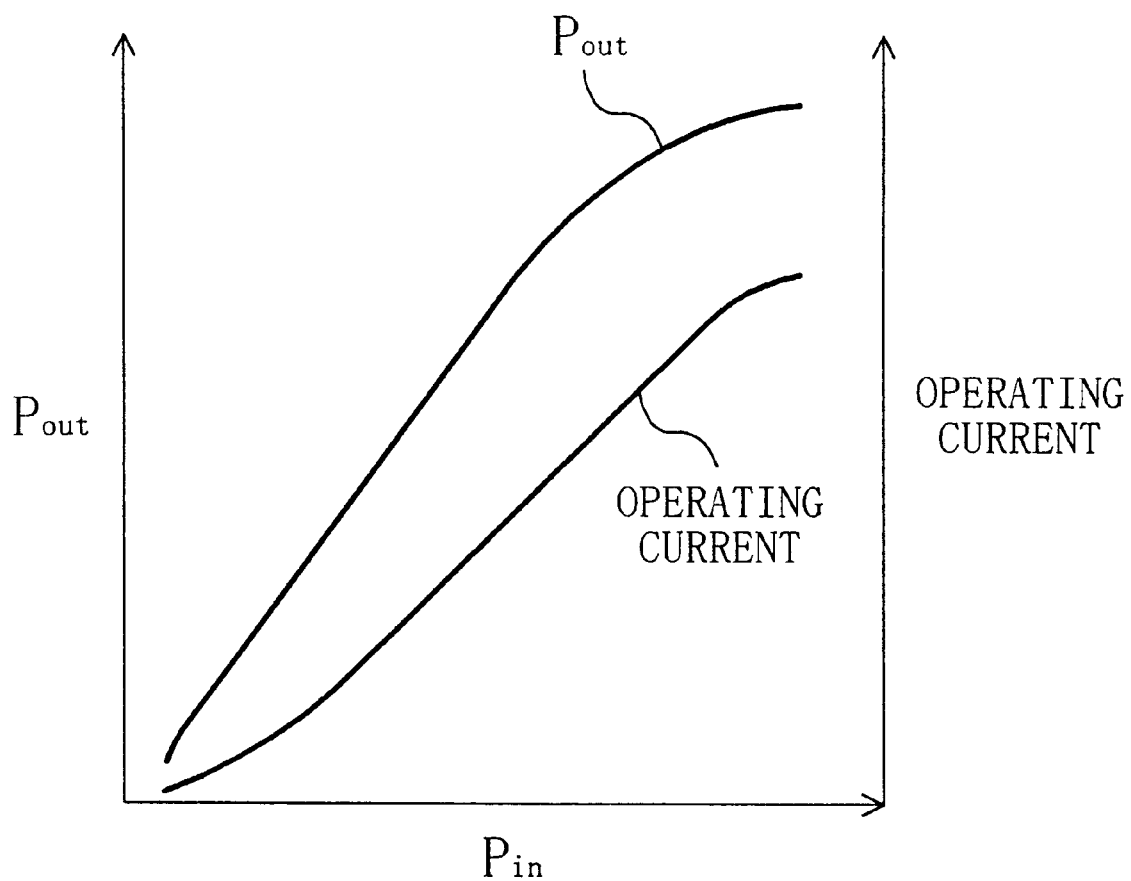
FIG. 14 shows the input-output characteristics of the high-frequency power and the total operating currents of the former-stage and latter-stage transistors for high-frequency power in the high-frequency power amplifier of the sixth embodiment of the present invention.

FIG. 14 shows the input-output characteristics ($P_{out}$) of the high-frequency power and the total operating currents of the former-stage and latter-stage transistors $Tr_1$ and $Tr_2$ for high-frequency power in the high-frequency power amplifier of the sixth embodiment. As shown in FIG. 14, as the outputted high-frequency power becomes small, the total current consumption is greatly reduced.

(EMBODIMENT 7)

Figure 8:
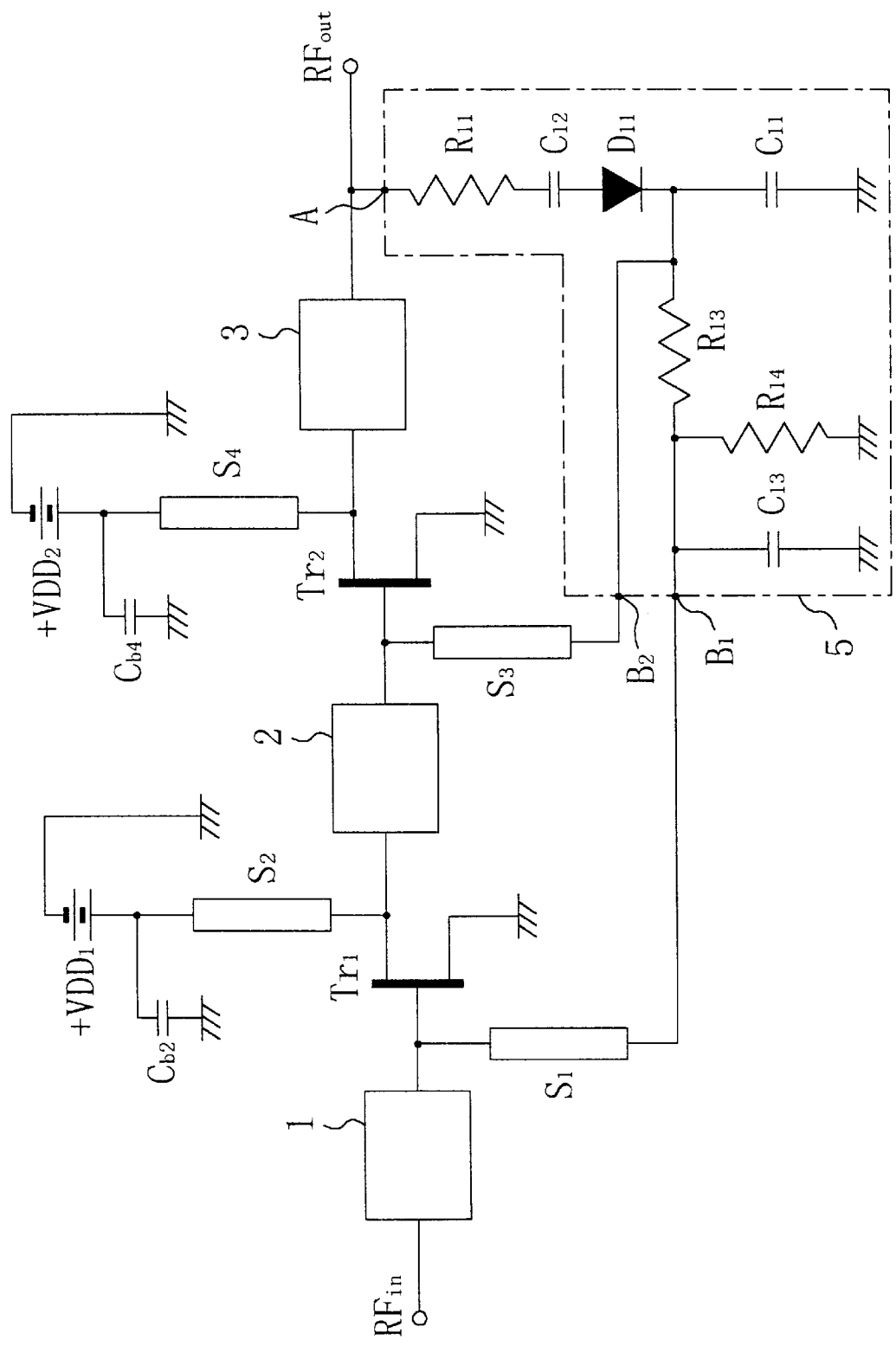
FIG. 8 shows the circuit diagram of the high-frequency power amplifier of a seventh embodiment of the present invention.

The high-frequency power amplifier of a seventh embodiment of the present invention will be described as follows with reference to FIG. 8. FIG. 8 shows the circuit structure of the high-frequency power amplifier of the seventh embodiment, where the same components as those of the first conventional high-frequency power amplifier shown in FIG. 15, or as those of the first embodiment shown in FIG. 1, are assigned the same reference numbers, and their description will be omitted.

As a feature of the seventh embodiment, a two-output positive voltage generation circuit 5 is provided which generates positive voltage that increases or decreases in accordance with an increase or decrease in the entered high-frequency power. The input unit of the two-output positive voltage generation circuit 5 is provided with a power detection point A, and the output unit is provided with a first positive voltage output point $B_1$ and a second positive voltage output point $B_2$. As shown in FIG. 8, the two-output positive voltage generation circuit 5 comprises a resistance $R_{11}$ (a detection circuit) which detects part of the entered high-frequency power, a capacitor $C_{12}$ which eliminates a direct-current component from the detected high-frequency power and outputs minute high-frequency power, a diode $D_{11}$ (a rectification circuit) which rectifies the minute high-frequency power outputted from the capacitor $C_{12}$ and outputs pulsating positive voltage, and a capacitor $C_{11}$ and first and second division resistances $R_{13}$ and $R_{14}$ (a smoothing circuit) which smooth the pulsating positive voltage outputted from the diode $D_{11}$ and output positive voltage. As apparent from FIG. 8, the two-output positive voltage generation circuit 5 does not have a negative direct-current bias power supply.

As another feature of the seventh embodiment, the power detection point A in the two-output positive voltage generation circuit 5 is connected with the output terminal of the output impedance matching circuit 3, whereas the first positive voltage output point $B_1$ and the second positive voltage output point $B_2$ are connected with each input terminal of the first microstrip line $S_1$ and the third microstrip line $S_3$, respectively.

Consequently, the two-output positive voltage generation circuit 5 detects part of the high-frequency power outputted from the output impedance matching circuit 3, and outputs positive voltage which increases or decreases in accordance with an increase or decrease in the detected high-frequency power to the input terminal of the former-stage transistor $Tr_1$ via the first microstrip line $S_1$ and to the input terminal of the latter-stage transistor $Tr_2$ via the third microstrip line $S_3$.

Since the resistance of the smoothing circuit is composed of the first division resistance $R_{13}$ and the second division resistance $R_{14}$, it becomes possible to output comparatively small positive voltage to the input terminal of the former-stage transistor $Tr_1$, and comparatively large positive voltage to the input terminal of the latter-stage transistor $Tr_2$.

Thus, according to the seventh embodiment, even if there is a difference in current-voltage characteristics between the former-stage transistor $Tr_1$ for high-frequency power and the latter-stage transistor $Tr_2$ for high-frequency power, the operating current can be reduced without fail when the outputted high-frequency power is small.

(EMBODIMENT 8)

Figure 9:
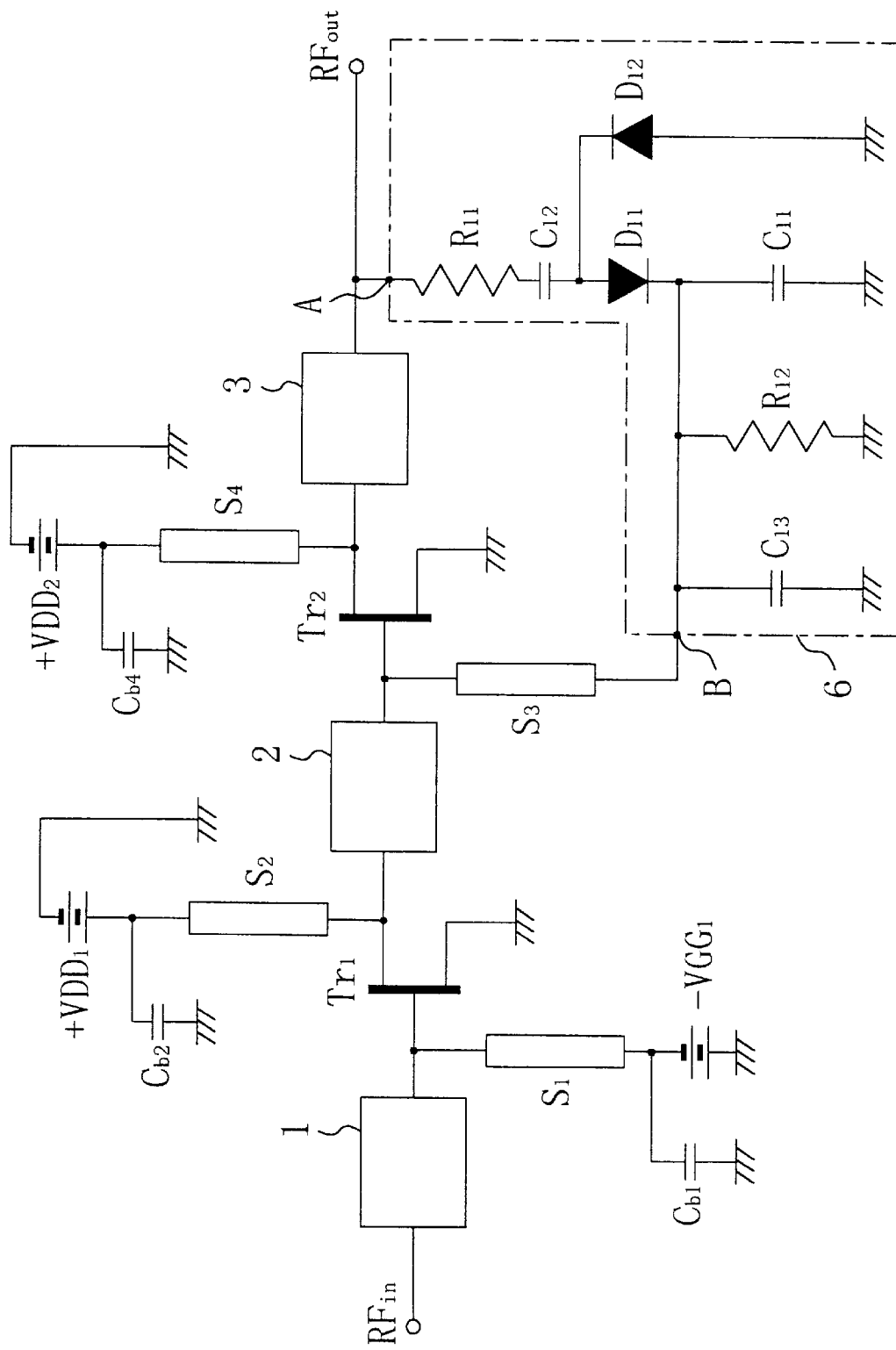
FIG. 9 shows the circuit diagram of the high-frequency power amplifier of an eighth embodiment of the present invention.

The high-frequency power amplifier of an eighth embodiment of the present invention will be described as follows with reference to FIG. 9. FIG. 9 shows the circuit structure of the high-frequency power amplifier of the eighth embodiment, where the same components as those of the first conventional high-frequency power amplifier shown in FIG. 15, or as those of the first embodiment shown in FIG. 1, are assigned the same reference numbers, and their description will be omitted.

As a feature of the eighth embodiment, a double positive voltage generation circuit 6 is provided which generates positive voltage that increases or decreases in accordance with an increase or decrease in the entered high-frequency power. The input unit of the double positive voltage generation circuit 6 is provided with a power detection point A, and the output unit is provided with a positive voltage output point B. As shown in FIG. 9, the double positive voltage generation circuit 6 comprises a resistance $R_{11}$ (a detection circuit) which detects part of the entered high-frequency power, a capacitor $C_{12}$ which eliminates a direct-current component from the detected high-frequency power and outputs minute high-frequency power, a first diode $D_{11}$ and a second diode $D_{12}$ (a double voltage rectification circuit) which rectify the minute high-frequency power outputted from the capacitor $C_{12}$ and output pulsating positive voltage, and a capacitor $C_{11}$ and a resistance $R_{12}$ (a smoothing circuit) which smooth the pulsating positive voltage outputted from the first and second diodes $D_{11}$ and $D_{12}$ and output double positive voltage. As apparent from FIG. 9, the double positive voltage generation circuit 6 does not have a negative direct-current bias power supply.

Although the rectification circuit in the positive voltage generation circuit 4 or the two-output positive voltage generation circuit 5 performs half-wave rectification, the double voltage rectification circuit 6 in the eighth embodiment performs full-wave rectification. Consequently, the voltage generated on both ends of the resistance $R_{12}$ can be doubled, and accordingly, the absolute value of the high-frequency power required to generate predetermined positive voltage can be halved. Thus, the high-frequency power extracted at the power detection point A can be reduced, which leads to a decrease in the loss of the high-frequency power. For example, the power detection point A requires high-frequency power of 10 dBm in the positive voltage generation circuit 4 and the two-output positive voltage generation circuit 5; however, the high-frequency power to be required is only 7 dBm in the double positive voltage generation circuit 6.

(EMBODIMENT 9)

Figure 10:
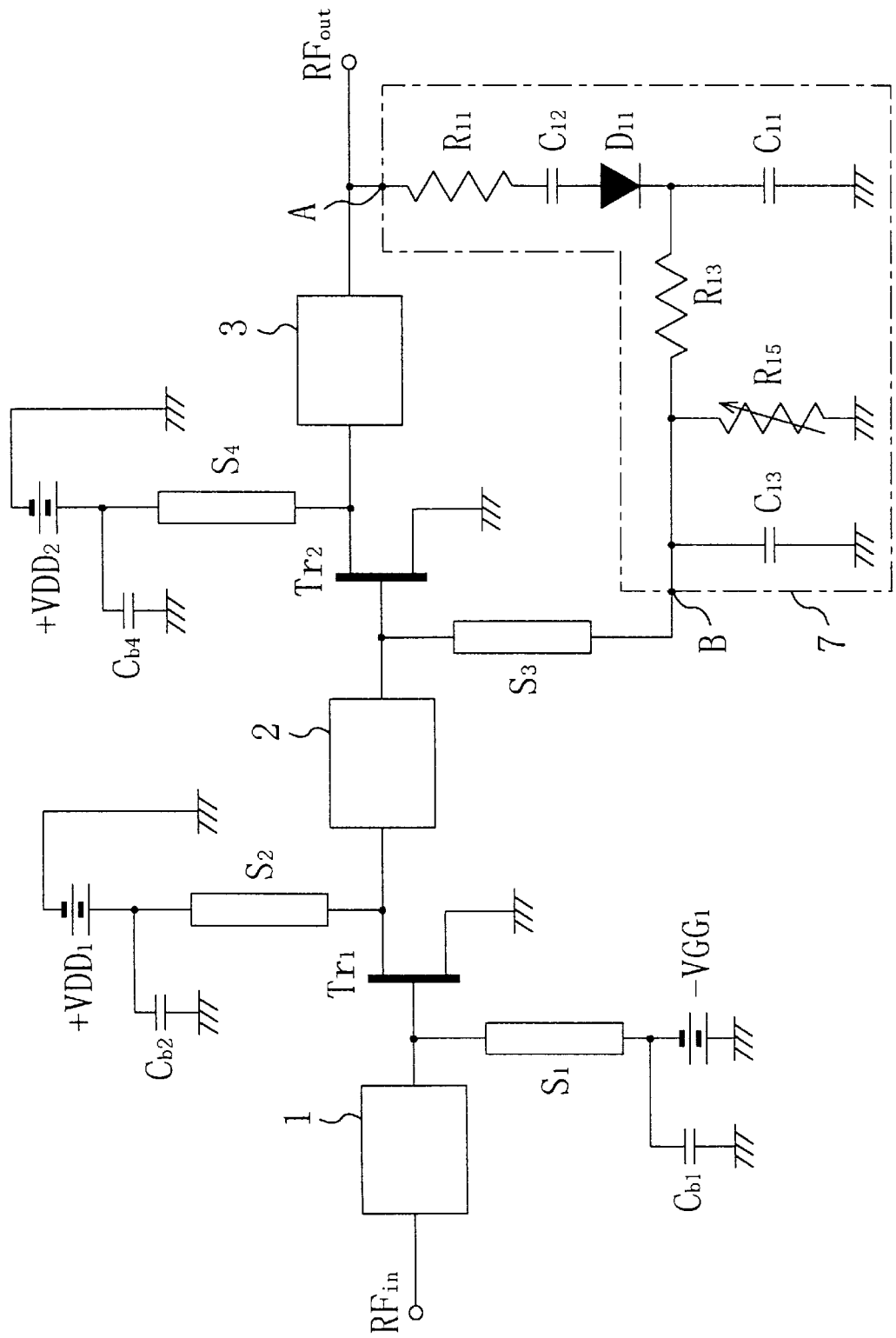
FIG. 10 shows the circuit diagram of the high-frequency power amplifier of a ninth embodiment of the present invention.

The high-frequency power amplifier of a ninth embodiment of the present invention will be described as follows with reference to FIG. 10. FIG. 10 shows the circuit structure of the high-frequency power amplifier of the ninth embodiment, where the same components as those of the first conventional high-frequency power amplifier shown in FIG. 15, or as those of the first embodiment shown in FIG. 1, are assigned the same reference numbers, and their description will be omitted.

As a feature of the ninth embodiment, a variable positive voltage generation circuit 7 is provided which generates positive voltage that increases or decreases in accordance with an increase or decrease in the entered high-frequency power. The input unit and the output unit of the variable positive voltage generation circuit 7 are provided with a power detection point A and a positive voltage output point B, respectively. As shown in FIG. 10, the variable positive voltage generation circuit 7 comprises a resistance $R_{11}$ (a detection circuit) which detects part of the entered high-frequency power, a capacitor $C_{12}$ which eliminates a direct-current component from the detected high-frequency power and outputs minute high-frequency power, a diode $D_{11}$ (a rectification circuit) which rectifies the minute high-frequency power outputted from the capacitor $C_{12}$ and outputs pulsating positive voltage, and a capacitor $C_{11}$, an invariable division resistance $R_{13}$ and a variable division resistance $R_{15}$ (a smoothing circuit) which smooth the pulsating positive voltage outputted from the diode $D_{11}$ and output positive voltage. As apparent from FIG. 10, the variable positive voltage generation circuit 7 does not have a negative direct-current bias power supply.

According to the ninth embodiment, the variable division resistance $R_{15}$ can control the positive voltage to be outputted to the input terminal of the latter-stage transistor $Tr_2$ for high-frequency power via the third microstrip line $S_3$ as the second input bias circuit. Therefore, even if the current-voltage characteristics greatly change when the current starts to flow towards the latter-stage transistor $Tr_2$, the resistance value of the variable division resistance $R_{15}$ can be adjusted in accordance with the changes in the current-voltage characteristics, which can realize the high-frequency power amplifier whose gains and outputs do not change.

(EMBODIMENT 10)

Figure 11:
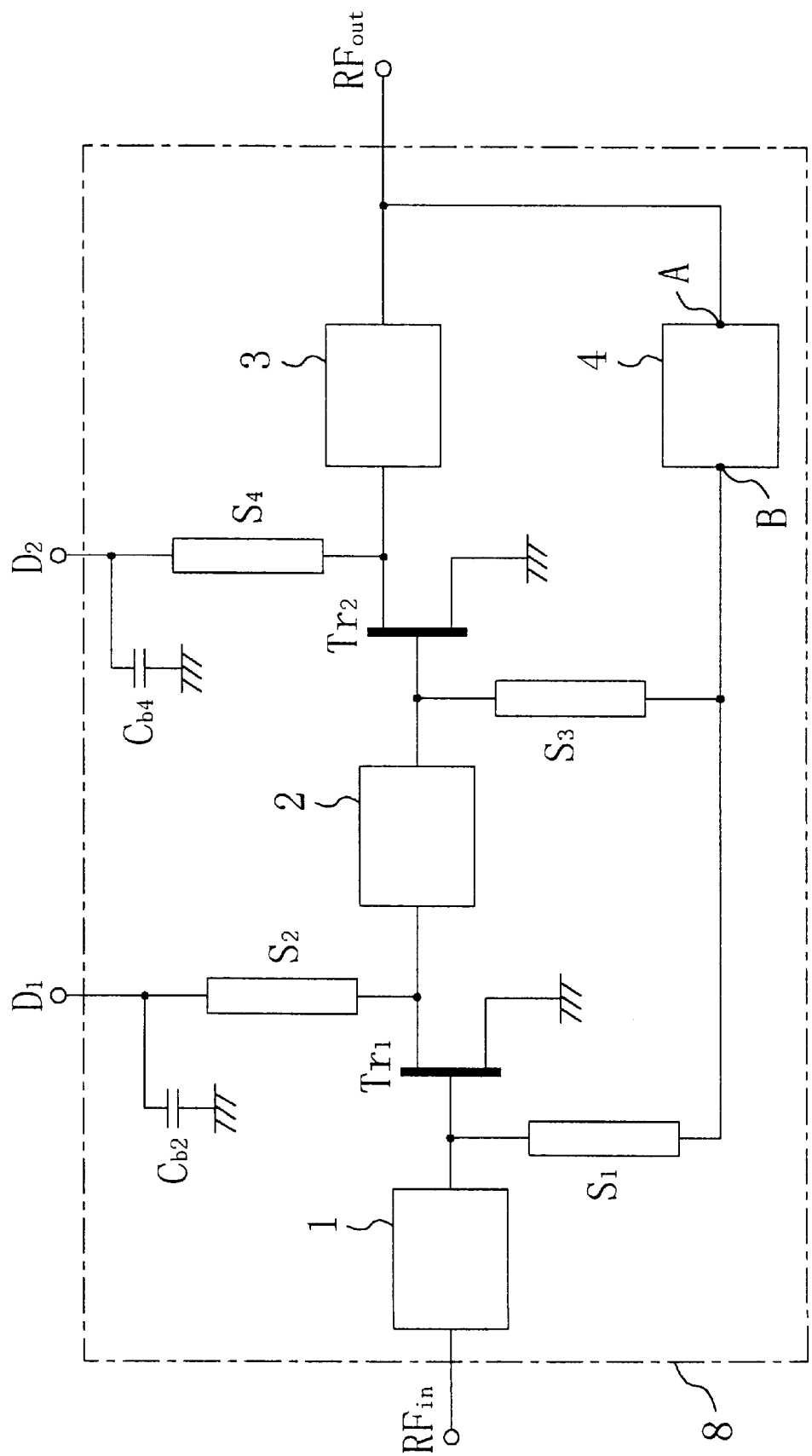
FIG. 11 shows the circuit diagram of the high-frequency power amplifier of a tenth embodiment of the present invention, which consists of an MMIC.

The high-frequency power amplifier of a tenth embodiment of the present invention will be described as follows with reference to FIG. 11. FIG. 11 shows an MMIC which is composed of the high-frequency power amplifier of the sixth embodiment shown in FIG. 7 mounted on a semiconductor substrate 8, where the same components as those of the first conventional high-frequency power amplifier shown in FIG. 15, as those of the first embodiment shown in FIG. 1, or as those of the sixth embodiment shown in FIG. 7 are assigned the same reference numbers, and their description will be omitted.

As a feature of the tenth embodiment, all of the former-stage and latter-stage transistors $Tr_1$ and $Tr_2$ for high-frequency power, the first-fourth microstrip lines $S_1$–$S_4$, the input impedance matching circuit 1, the interstage impedance matching circuit 2, the output impedance matching circuit 3, and the positive voltage generation circuit 4 are mounted on the same semiconductor substrate 8.

According to the tenth embodiment, the use of a compound semiconductor substrate containing gallium-arsenic (GaAs) as the semiconductor substrate 8 enables the MMIC to be formed in a chip having several-millimeter sides.

In addition, positive voltage can be generated on the semiconductor substrate 8, without drawing the input bias circuit of the transistor for high-frequency power out from the chip. Consequently, when the MMIC is put in a resin package, the number of the lead terminals can be reduced, which can realize a high-frequency power amplifier that is small and requires no setting of the input bias circuit.

Figure 19:
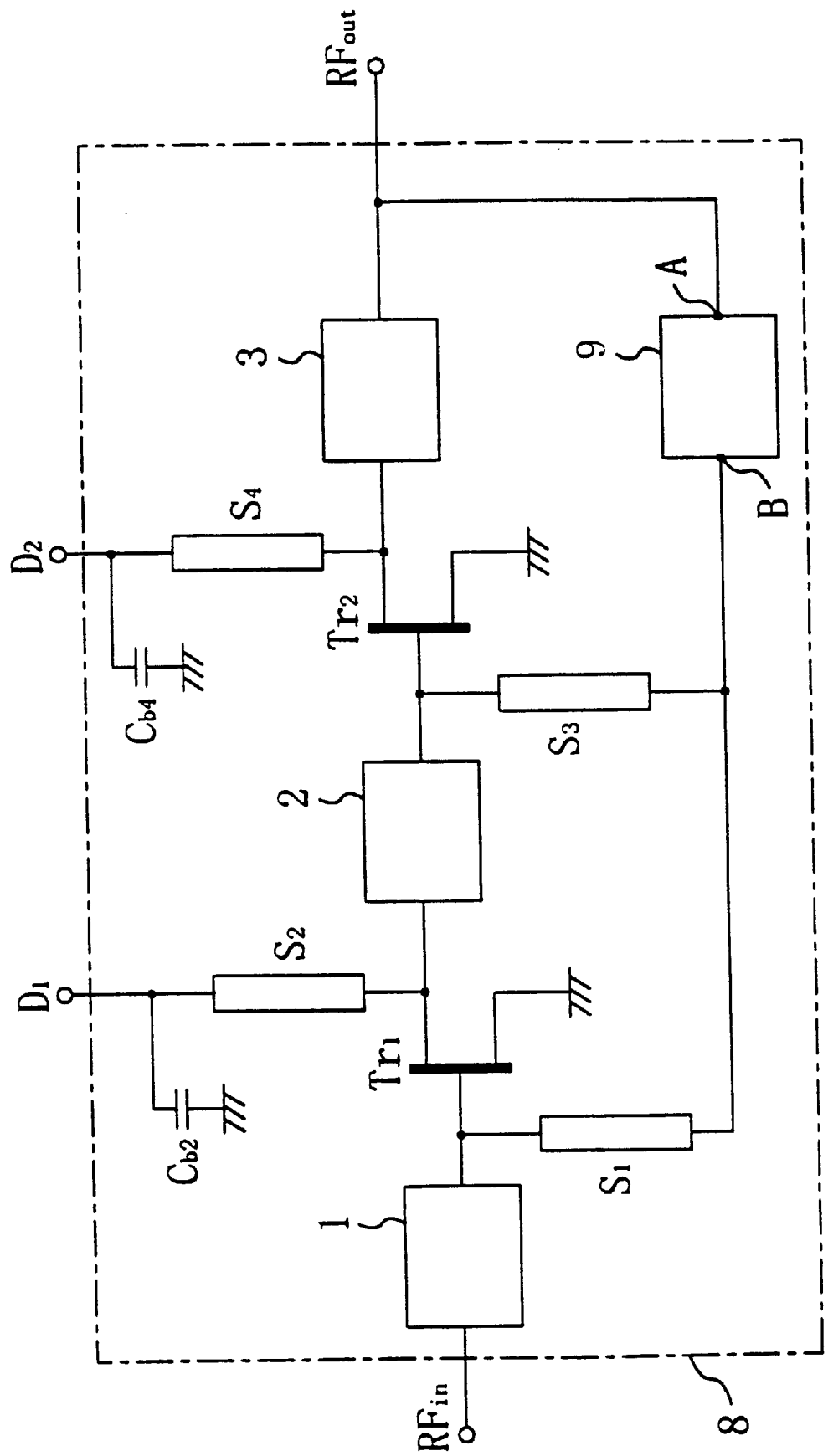
FIG. 19 shows the circuit diagram of the high-frequency power amplifier of a twelfth embodiment of the invention.

The tenth embodiment shows a case where the high-frequency power amplifier of the sixth embodiment is formed on the semiconductor substrate 8; however, it goes without saying that the high-frequency power amplifier of either one of the first-fifth and seventh-ninth embodiments may be formed on the semiconductor substrate 8 as illustrated in FIG 19 by generation circuit 9. Whereas generation circuit 9 represents any one of generation circuits 4–7.

(EMBODIMENT 11)

Figure 12:
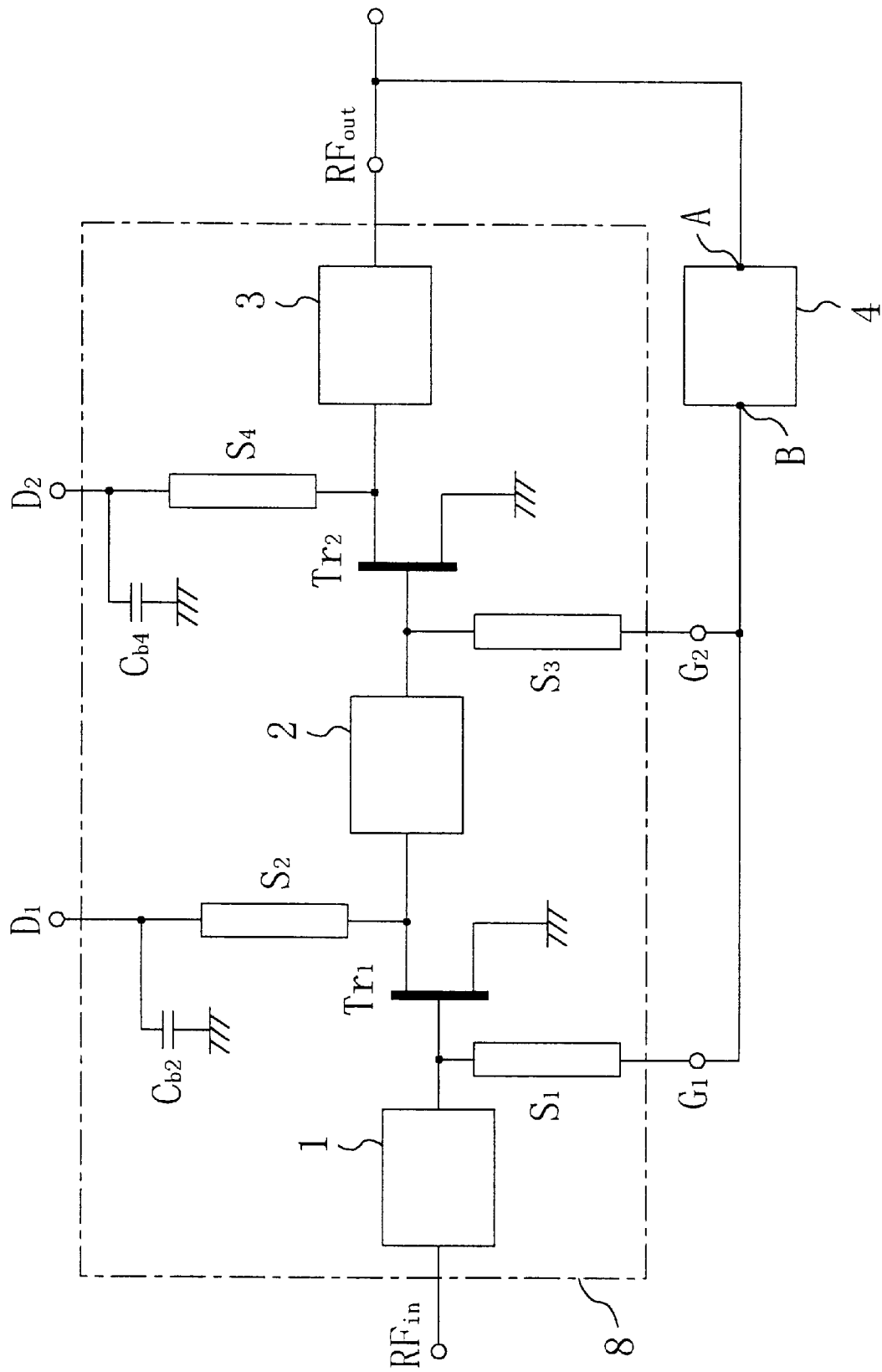
FIG. 12 shows the circuit diagram of the high-frequency power amplifier of an eleventh embodiment of the present invention, which is consists of an MMIC.

The high-frequency power amplifier of an eleventh embodiment of the present invention will be described as follows with reference to FIG. 12. FIG. 12 shows an MMIC which is composed of the components of the high-frequency power amplifier of the sixth embodiment shown in FIG. 7 mounted on the semiconductor substrate 8, except for the positive voltage generation circuit 4. Where the same components as those of the first conventional high-frequency power amplifier shown in FIG. 15, as those of the first embodiment shown in FIG. 1, or as those of the sixth embodiment shown in FIG. 7 assigned the same reference numbers, and their description will be omitted.

As a feature of the eleventh embodiment, all of the former-stage and latter-stage transistors $Tr_1$ and $Tr_2$ for high-frequency power, the first-fourth microstrip lines $S_1$–$S_4$, the input impedance matching circuit 1, the interstage impedance matching circuit 2, and the output impedance matching circuit 3 are mounted on the same semiconductor substrate 8, and the positive voltage generation circuit 4 is mounted on another semiconductor substrate.

According to the eleventh embodiment, the addition of the positive voltage generation circuit 4 from outside to the MMIC having a conventional structure can simplify the input bias circuit of the high-frequency power amplifier, and at the same time, can miniaturize the high-frequency power amplifier.

The eleventh embodiment shows a case where the components of the high-frequency power amplifier of the sixth embodiment except for the positive voltage generation circuit 4 are formed on the semiconductor substrate 8; however, it goes without saying that either one of the positive voltage generation circuit 4 in the first-fifth embodiments, the two-output positive voltage generation circuit 5 in the seventh embodiment, the double positive voltage generation circuit 6 in the eighth embodiment, or the variable positive voltage generation circuit 7 in the ninth embodiment may be formed on the semiconductor substrate 8.

What is claimed is:

1. A high-frequency power amplifier comprising:
   a transistor for high-frequency power which operates and whose current-voltage characteristics greatly change when positive voltage is supplied on an input terminal of said transistor;
   an input bias circuit connected with the input terminal of said transistor;
   an output bias circuit connected with an output terminal of said transistor;
   an input impedance matching circuit connected with the input terminal of said transistor;
   an output impedance matching circuit connected with the output terminal of said transistor; and a positive voltage generation circuit, wherein said positive voltage generation circuit comprises:

a detection circuit for detecting and outputting part of high-frequency power to be entered to said transistor or to be outputted from said transistor;

a rectification circuit whose input terminal is connected with an output terminal of said detection circuit, said rectification circuit rectifying said part of the high-frequency power outputted from said detection circuit and outputting a pulsating positive voltage; and a smoothing circuit whose input terminal is connected with an output terminal of said rectification circuit and whose output terminal is connected with an input terminal of said input bias circuit, said smoothing circuit smoothing the pulsating positive voltage outputted from said rectification circuit and outputting positive voltage, and wherein said smoothing circuit outputs positive voltage which increases or decreases in accordance with an increase or decrease of said part of the high-frequency power detected by said detection circuit to the input terminal of said input bias circuit without intervention of a direct-current power supply.

2. The high-frequency power amplifier of claim 1, wherein the input terminal of said detection circuit is connected with an input terminal of said input impedance matching circuit or an output terminal of said output impedance matching circuit.

3. The high-frequency power amplifier of claim 1, wherein the input terminal of said detection circuit is connected with an output terminal of said input impedance matching circuit or an input terminal of said output impedance matching circuit.

4. The high-frequency power amplifier of claim 1, wherein the input terminal of said detection circuit is connected with said output bias circuit.

5. The high-frequency power amplifier of claim 1, wherein said rectification circuit is composed of a pair of diodes which are connected in reverse directions and in parallel, said rectification circuit outputting double pulsating positive voltage.

6. The high-frequency power amplifier of claim 1, wherein said smoothing circuit comprises a capacitor and a variable resistance, and outputs positive voltage which changes in accordance with changes in a resistance value of said variable resistance.

7. The high-frequency power amplifier of claim 1, wherein said transistor is either an N-channel MOSFET, an NPN-type bipolar transistor, an N-channel MESFET, or an N-channel heterojunction FET.

8. The high-frequency power amplifier of claim 1, wherein said transistor, said input bias circuit, said output bias circuit, said input impedance matching circuit, said output impedance matching circuit, and said positive voltage generation circuit are formed on a same semiconductor substrate.

9. The high-frequency power amplifier of claim 1, wherein said transistor, said input bias circuit, said output bias circuit, said input impedance matching circuit, and said output impedance matching circuit are formed on a same semiconductor substrate.

10. A high-frequency power amplifier comprising:

a former-stage transistor for high-frequency power which operates and whose current-voltage characteristics greatly change when positive voltage is supplied on an input terminal of said former-stage transistor;

a first input bias circuit connected with the input terminal of said former-stage transistor;

a first output bias circuit connected with an output terminal of said former-stage transistor;

a first input impedance matching circuit connected with the input terminal of said former-stage transistor;

a first output impedance matching circuit connected with the output terminal of said former-stage transistor;

a latter-stage transistor for high-frequency power which operates and whose current-voltage characteristics greatly change when positive voltage is supplied on an input terminal of said latter-stage transistor;

a second input bias circuit connected with the input terminal of said latter-stage transistor;

a second output bias circuit connected with an output terminal of said latter-stage transistor;

a second input impedance matching circuit connected with the input terminal of said latter-stage transistor;

a second output impedance matching circuit connected with the output terminal of said latter-stage transistor; and a positive voltage generation circuit, wherein said positive voltage generation circuit comprises:

a detection circuit for detecting and outputting part of high-frequency power to be entered to said latter-stage transistor or to be outputted from said latter-stage transistor;

a rectification circuit whose input terminal is connected with an output terminal of said detection circuit, said rectification circuit rectifying said part of the high-frequency power outputted from said detection circuit and outputting a pulsating positive voltage; and a smoothing circuit whose input terminal is connected with an output terminal of said rectification circuit and whose output terminal is connected with each input terminal of said first input bias circuit and said second input bias circuit, said smoothing circuit smoothing the pulsating positive voltage outputted from said rectification circuit and outputting positive voltage, and wherein said smoothing circuit outputs positive voltage which increases or decreases in accordance with an increase or decrease in said part of the high-frequency power detected by said detection circuit to said each input terminal of said first input bias circuit and said second input bias circuit without intervention of a direct-current power supply.

11. The high-frequency power amplifier of claim 10, wherein said rectification circuit is composed of a pair of diodes which are connected in reverse directions and in parallel, said rectification circuit outputting double pulsating positive voltage.

12. The high-frequency power amplifier of claim 10, wherein said smoothing circuit comprises a voltage division circuit which divides positive voltage into first positive voltage and second positive voltage, and outputs the first positive voltage and the second positive voltage to the input terminal of said first input bias circuit and the input terminal of said second input bias circuit, respectively.

13. The high-frequency power amplifier of claim 12, wherein said voltage division circuit is composed of a plurality of division resistances including at least one variable resistance, and outputs the first positive voltage or the second positive voltage which changes in accordance with changes in a resistance value of said at least one variable resistance.

14. The high-frequency power amplifier of claim 10, wherein each of said former-stage transistor and said latter-stage transistor is either an N-channel MOSFET, and NPN-type bipolar transistor, an N-channel MESFET, or an N-channel heterojunction FET.

15. The high-frequency power amplifier of claim 10, wherein said former-stage transistor, said first input bias circuit, said first output bias circuit, said first input impedance matching circuit, said first output impedance matching circuit, said latter-stage transistor, said second input bias circuit, said second output bias circuit, said second input impedance matching circuit, said second output impedance matching circuit, and said positive voltage generation circuit are formed on a same semiconductor substrate.

16. The high-frequency power amplifier of claim 10, wherein said former-stage transistor, said first input bias circuit, said first output bias circuit, said first input impedance matching circuit, said first output impedance matching circuit, said latter-stage transistor, said second input bias circuit, said second output bias circuit, said second input impedance matching circuit, and said second output impedance matching circuit are formed on a same semiconductor substrate.

* * * * *

UNITED STATES PATENT AND TRADEMARK OFFICE
CERTIFICATE OF CORRECTION

PATENT NO. : 5,982,236
DATED : November 9, 1999
INVENTOR(S) : Ishikawa et al.

It is certified that error appears in the above-identified patent and that said Letters Patent is hereby corrected as shown below:

On the cover page:
Item [56]
In "Other Publications" section, after last reference, insert:

--Buoli C., et al., "ADAPTING COMPENSATION FOR MICROWAVE LINEARIZER", PROCEEDINGS OF THE 23rd EUROPEAN MICROWAVE CONFERENCE, MADRID, SEPT. 6-9, 1993, 6 SEPTEMBER 1993, EUROPEAN MICROWAVE CONFERENCE COMMITTEE, pages 439-442, XP000629958 * page 439-page 440, figures 1,4*--

Signed and Sealed this

Fifteenth Day of August, 2000

Attest:

Q. TODD DICKINSON

*Attesting Officer*    *Director of Patents and Trademarks*